(12) United States Patent
Yamamoto et al.

(10) Patent No.: US 7,446,348 B2
(45) Date of Patent: Nov. 4, 2008

(54) LIGHT EMITTING DEVICE WITH FILLED TETRAHEDRAL (FT) SEMICONDUCTOR IN THE ACTIVE LAYER

(75) Inventors: Kazushige Yamamoto, Yokohama (JP); Tatsuo Shimizu, Tokyo (JP); Shigeru Haneda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 11/533,149

(22) Filed: Sep. 19, 2006

(65) Prior Publication Data
US 2007/0152234 A1     Jul. 5, 2007

(30) Foreign Application Priority Data
Nov. 30, 2005 (JP) .............................. 2005-346601

(51) Int. Cl.
*H01L 27/15* (2006.01)
(52) U.S. Cl. .................. 257/102; 257/E33.01; 313/502
(58) Field of Classification Search ................. 257/103, 257/102, E33.01, E33.022, E33.023; 313/502, 313/503, 506, 113
See application file for complete search history.

(56) References Cited

U.S. PATENT DOCUMENTS

2004/0109328 A1* 6/2004 Dahl et al. .................. 362/555
2007/0152234 A1   7/2007 Yamamoto et al.

OTHER PUBLICATIONS

Der-Gao Lin and Timothy Rost"The Impact of Fluorine on CMOS Channel Length and Shallow Junction Formation", IEEE 1993.*
U.S. Appl. No. 11/553,149, filed Sep. 19, 2006, Yamamoto et al.
U.S. Appl. No. 11/688,595, filed Mar. 30, 2007, Yamamoto et al.
H.W.A.M. Rompa, et al., "Predicted Modifications in the Direct and Indirect Gaps of Tetrahedral Semiconductors", Physical Review Letters, vol. 52, No. 8, Feb. 20, 1984, pp. 675-678.
D.M. Wood, et al., "Electronic structure of filled tetrahedral semiconductors", Physical Review B, vol. 31, No. 4, Feb. 15, 1985, pp. 2570-2573.
N. Buerger, et al., "New Class of Related Optical Defects in Silicon Implanted with the Noble Gases He, Ne, Ar, Kr, and Xe", Physical Review Letters, vol. 52, No. 18, Apr. 30, 1984, pp. 1645-1648.
U.S. Appl. No. 11/837,932, filed Aug. 13, 2007, Shimizu et al.
U.S. Appl. No. 11/531,426, filed Sep. 13, 2006, Shimizu et al.
U.S. Appl. No. 11/845,412, filed Aug. 27, 2007, Yamamoto et al.

* cited by examiner

*Primary Examiner*—Marcos D. Pizarro
*Assistant Examiner*—Eva Montalvo
(74) *Attorney, Agent, or Firm*—Oblon, Spivak, McClelland, Maier & Neustadt, P.C.

(57) ABSTRACT

A light emitting device includes an active layer including atoms A of a matrix semiconductor having a tetrahedral structure, a heteroatom D substituted for the atom A in a lattice site, and a heteroatom Z inserted into an interstitial site positioned closest to the heteroatom D, the heteroatom D having a valence electron number differing by +1 or −1 from that of the atom A, and the heteroatom Z having an electron configuration of a closed shell structure through charge compensation with the heteroatom D, and an n-electrode and a p-electrode adapted to supply a current to the active layer.

15 Claims, 21 Drawing Sheets

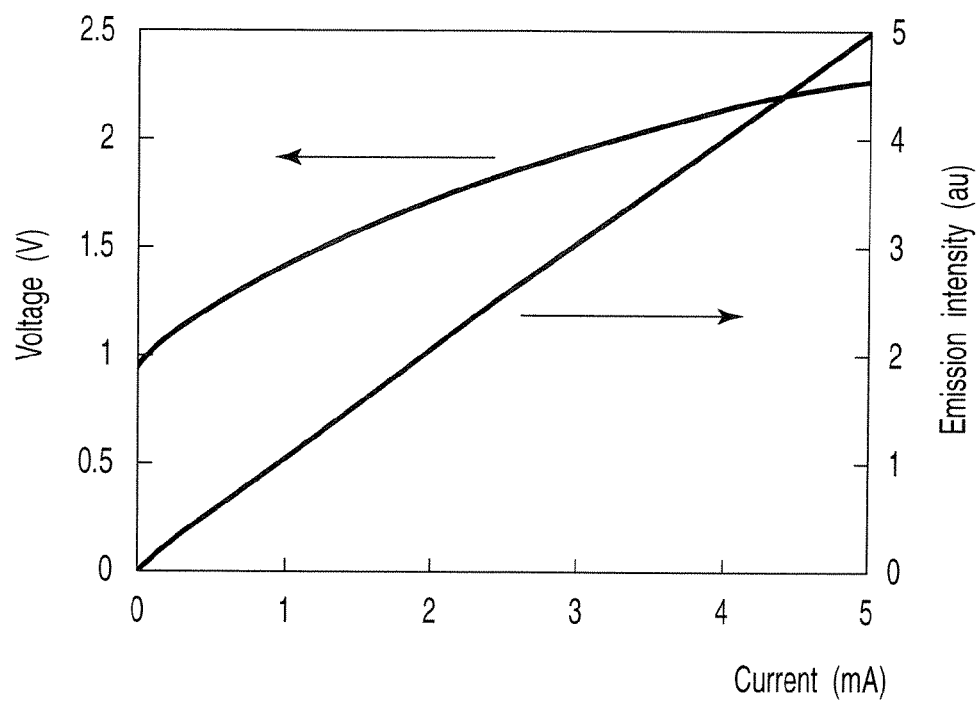
F I G. 1 6
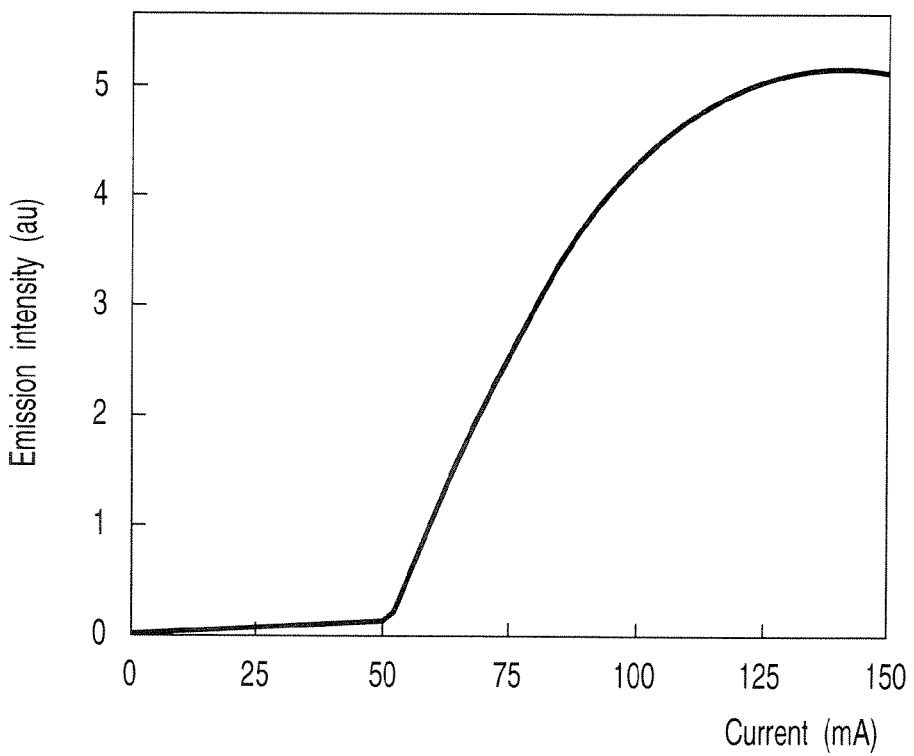
F I G. 1 8

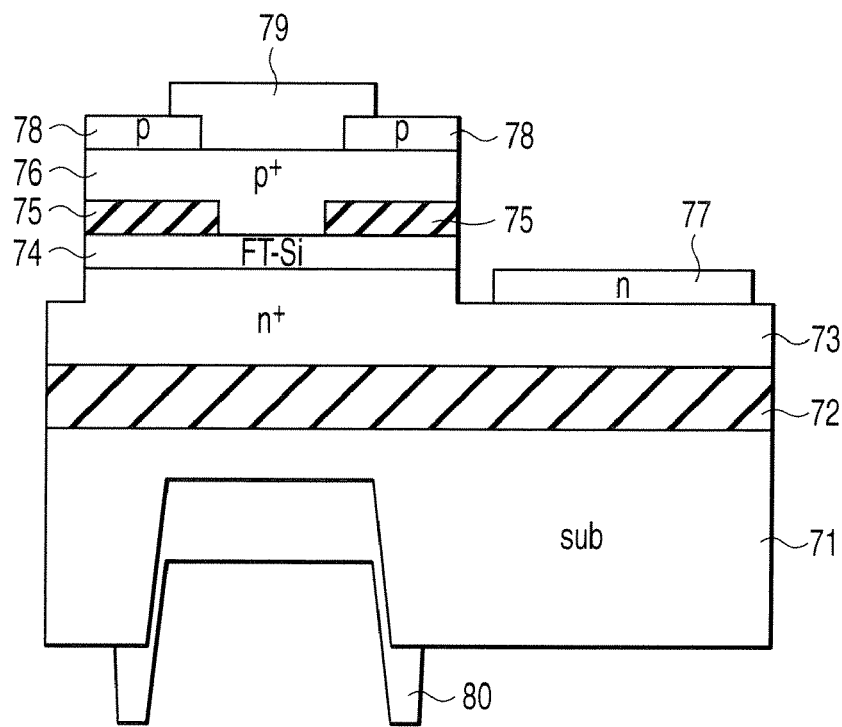
F I G. 19 A
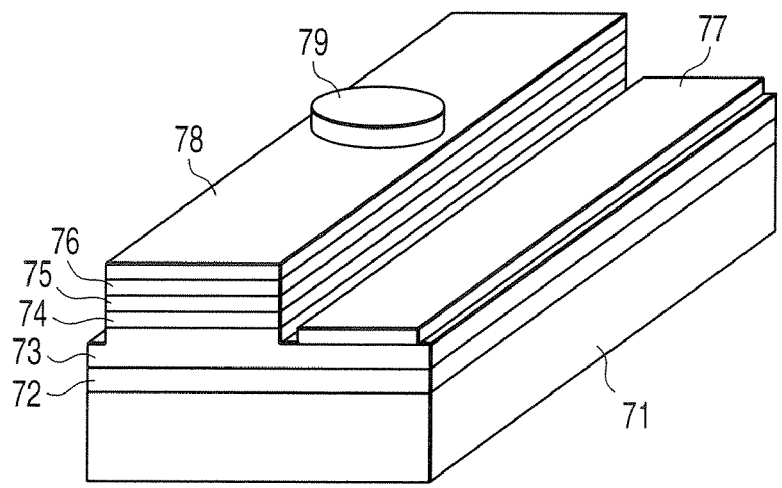
F I G. 19 B

LIGHT EMITTING DEVICE WITH FILLED TETRAHEDRAL (FT) SEMICONDUCTOR IN THE ACTIVE LAYER

CROSS-REFERENCE TO RELATED APPLICATIONS

This application is based upon and claims the benefit of priority from prior Japanese Patent Application No. 2005-346601, filed Nov. 30, 2005, the entire contents of which are incorporated herein by reference.

BACKGROUND OF THE INVENTION

1. Field of the Invention

The present invention relates to a light emitting device based on a filled tetrahedral (FT) semiconductor.

2. Description of the Related Art

In recent years, active research is being conducted on band engineering for modulating optical characteristics peculiar to a substance, such as emission and absorption, by modulating the energy band structure that has been considered to be inherent in the substance.

For example, a quantum dot (or a quantum wire or a superlattice) and a strain effect are well known as a typical band engineering technique. The quantum dot (or the quantum wire or the superlattice) brings about a modulated band structure by reducing the size of a substance three-dimensionally (or two-dimensionally or one-dimensionally) and confining electrons therein. The strain effect denotes an effect of modulating a band structure by applying a tensile stress or a compression stress to a substance.

On the other hand, a filled tetrahedral (FT) semiconductor is theoretically proposed as a band engineering method for modulating the band structure of a semiconductor in a quite different principle (see H.W.A.M. Rompa et al., Phys. Rev. Lett., 52, 675 (1984); D. M. Wood et al., Phys. Review B31, 2570 (1985)).

The FT semiconductor is referred to as a solid substance in which a rare gas atom or a diatomic molecule with an electron configuration of a closed shell structure is introduced into the interstitial site of a matrix semiconductor having a tetrahedral structure such as a diamond structure or a zinc blende structure, as shown in FIG. 1.

A difference in the band structure between ordinary crystal silicon and an FT semiconductor will now be described. FIG. 2A is a band diagram of crystalline silicon, and FIG. 2B is a band diagram of silicon doped with He. FIG. 2B shows the result of the first principle band calculation in respect of silicon with an FT structure (hereinafter referred to as an FT-silicon),in which a He atom is imaginarily inserted in the interstitial site of crystalline silicon. As apparent from these diagrams, the band structure the FT-silicon is modulated into a direct transition type well resembling that of GaAs in which the shape of the conduction band is widely varied from that of the crystalline silicon. One of the effects of the FT semiconductor is that an indirect band structure of an indirect semiconductor represented by silicon, that is non-emissive, is greatly modulated into a direct band structure as to exhibit light-emitting characteristics (or transition probability) of a level comparable to those of a direct semiconductor such as GaAs.

However, the rare gas-containing FT semiconductor or molecule-containing FT semiconductor proposed by Rompa et al. is believed to be thermally unstable because the inserted substance can move within the crystal and, thus, not to be suitable for practical use.

Concerning the FT semiconductor, the result of an experiment is reported that, if rare gas atoms are ion-implanted in a silicon wafer, photoluminescence (PL emission) is generated in the energy region in the vicinity of 1 eV, though the mechanism of the PL emission is not clarified (see N. Burger et al., Phys. Rev. Lett., 52, 1645 (1984). However, if the wafer in which the rare gas atoms have been ion-implanted is annealed, the PL emission is caused to disappear, though the reason therefor is again not clear. It is believed that the disappearance of PL emission is derived from the fact that, since the rare gas atom is not chemically bonded with the silicon atom, the rare gas atom is diffused within the silicon crystal and may be finally released from the wafer.

Under the circumstances, it can be easily expected that the rare gas-containing FT semiconductor or molecule-containing FT semiconductor, which can certainly form the FT structure, may be poor in lower thermal stability. In short, there is a problem that the FT semiconductor will not be a practical material system.

As described above, the FT semiconductor as a novel band engineering technique can produce the effect of providing a light-emitting function to an indirect semiconductor. However, there is a problem that the FT semiconductor in which a closed-shell substance such as a rare gas atom or diatomic molecule is inserted into the interstitial site is poor in thermal stability and is not practical because the closed-shell substance is not chemically bonded with the matrix semiconductor.

BRIEF SUMMARY OF THE INVENTION

A light emitting device according to an aspect of the present invention, comprising: an active layer comprising atoms A of a matrix semiconductor having a tetrahedral structure, a heteroatom D substituted for the atom A in a lattice site, and a heteroatom Z inserted into an interstitial site positioned closest to the heteroatom D, the heteroatom D having a valence electron number differing by +1 or −1 from that of the atom A, and the heteroatom Z having an electron configuration of a closed shell structure through charge compensation with the heteroatom D; and an n-electrode and a p-electrode adapted to supply a current to the active layer.

A phosphor according to another aspect of the present invention, comprising: atoms A of a matrix semiconductor having a tetrahedral structure, a heteroatom D substituted for the atom A in a lattice site, and a heteroatom Z inserted into an interstitial site positioned closest to the heteroatom D, the heteroatom D having a valence electron number differing by +1 or −1 from that of the atom A, and the heteroatom Z having an electron configuration of a closed shell structure through charge compensation with the heteroatom D.

BRIEF DESCRIPTION OF THE SEVERAL VIEWS OF THE DRAWING

FIG. 16 is a graph showing a relationship among a current, voltage and emission intensity of the silicon light emitting device according to the seventh embodiment;

FIG. 18 is a graph showing a relationship between a current and emission intensity of the LD device according to the eighth embodiment;

FIGS. 19A and 19B are a cross-sectional view and a perspective view, respectively, showing a structure of an LD device of a surface emission type according to the ninth embodiment;

DETAILED DESCRIPTION OF THE INVENTION

The main principle of function of the FT semiconductor (filled tetrahedral semiconductor) according to embodiments of the present invention will be described in detail.

Described in the first step are (1) why an indirect semiconductor such as silicon has an indirect band structure, and (2) why the indirect semiconductor in non-emissive. Further described briefly are (3) the feature of the FT semiconductor (rare gas-containing FT semiconductor and molecule-containing FT semiconductor) in comparison with other band engineering methods, and (4) the principle thereof. Still further described is (5) a novel FT semiconductor, i.e., a pendant type FT semiconductor, which constitutes the important part of the present invention.

Figure 1:
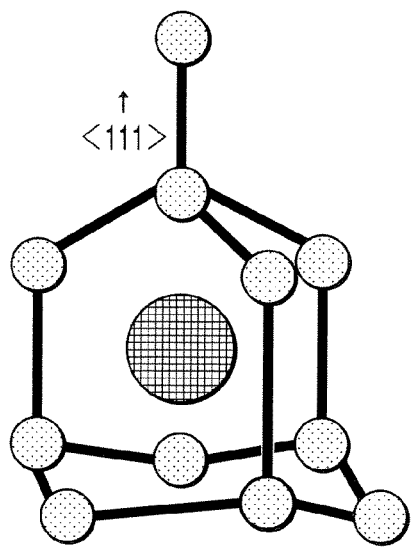
FIG. 1 shows a structure of an FT semiconductor.
Figure 2A:
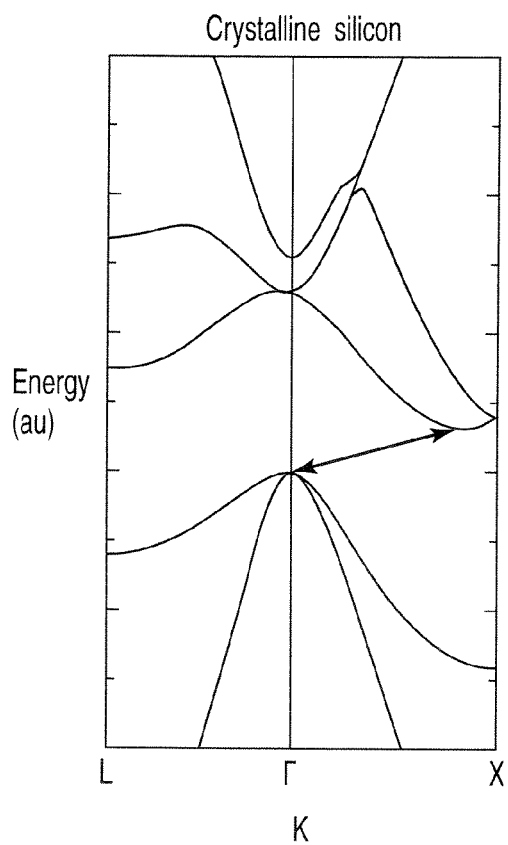
FIGS. 2A and 2B show band diagrams of crystalline silicon and He-doped FT-silicon, respectively.
Figure 2B:
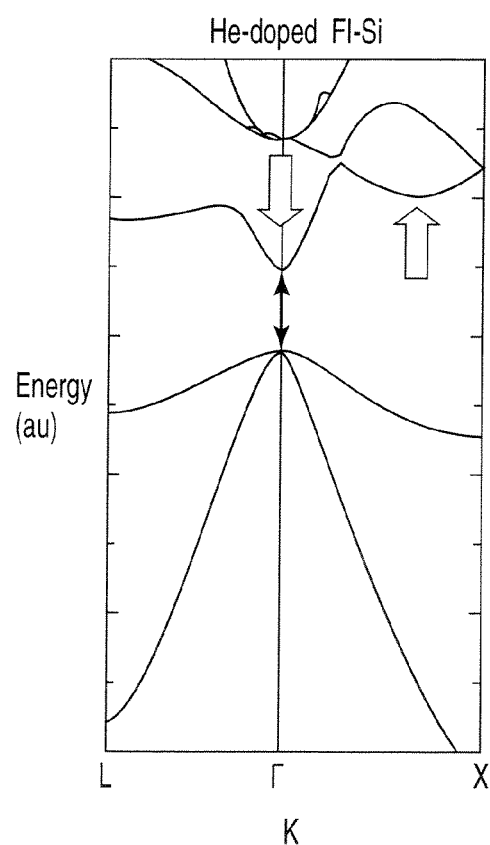
Figure 3:
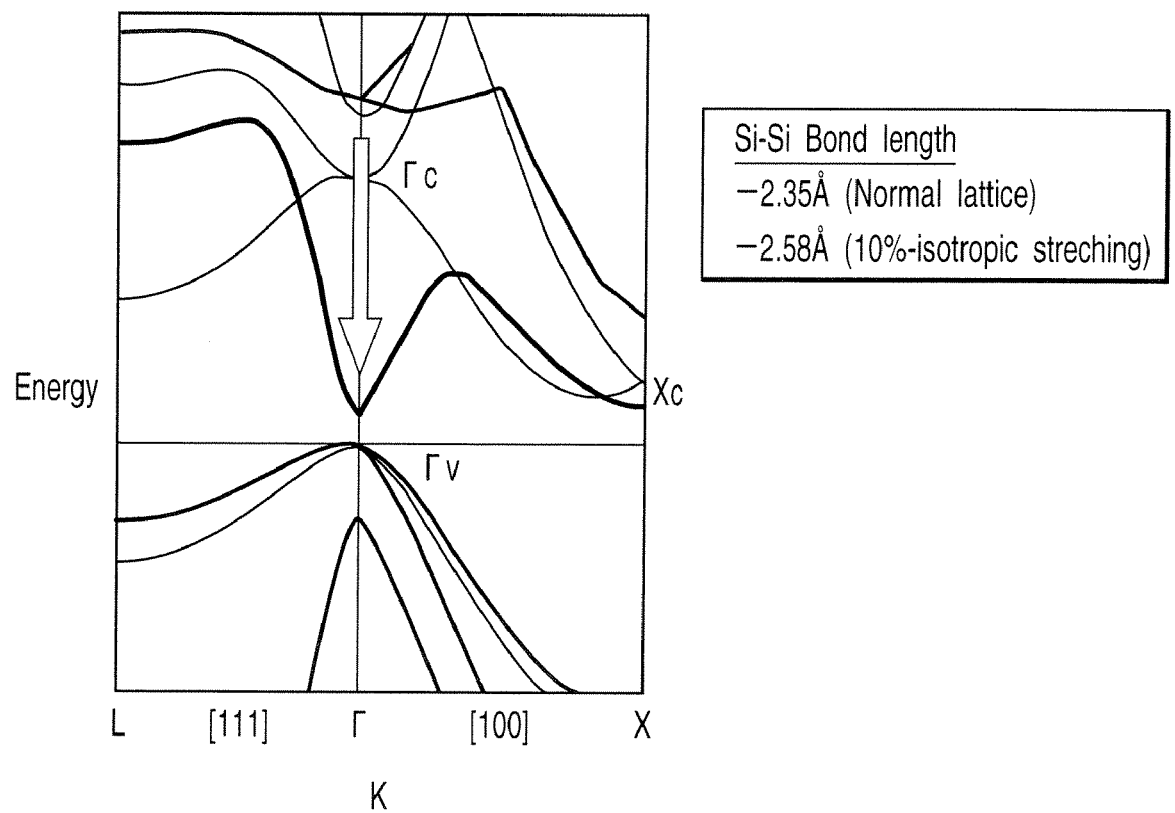
FIG. 3 shows a band diagram showing change in the band structure of silicon having isotropic stretching applied thereto.

(1) Band Structure of Indirect Semiconductor:

FIG. 3 shows the band structure of silicon. It is well known to the art that indirect semiconductors other than silicon have a band structure of the shape similar to that shown in FIG. 3. Originally, the main reason why silicon forms an indirect semiconductor resides in that the bond length d between the adjacent constituent atoms is relatively short. The energy difference $\Delta E$ between the conduction band and the valence band in the $\Gamma$ point is a function of the bond length d and can be represented approximately by $\Delta E \propto 1/d^2$. Therefore, the energy difference $\Delta E$ is rapidly diminished with increase in the bond length d and is changed to be adapted to a direct band structure.

FIG. 3 shows, together with the band structure of the normal lattice, the result of the calculation of the band structure of an imaginary lattice, covering the case where the lattice is stretched through a strain effect in the direction of the crystal axis <111> so as to increase the Si—Si bond length by 10%. In the drawing, the band structures of the normal lattice and of the imaginary lattice are depicted to permit the upper edges of the valence bands to be matched.

As shown in FIG. 3, if the bond length is increased, the conduction band is markedly dropped in the $\Gamma$ point, though a marked change is not observed in the X point, so as to be changed into a direct band structure resembling that of GaAs. Roughly speaking, the energy difference $\Delta E$ is diminished because the bond is elongated so as to decrease the repulsion energy between electrons, with the result that the conduction band (s-orbital) that is positioned upward in the normal lattice is lowered so as to approach the valence band (p-orbital).

(2) Optical Characteristics of an Indirect Semiconductor:

In the indirect semiconductor, the electric dipole transition is optically forbidden and, thus, the indirect semiconductor is essentially non-emissive. On the contrary, the direct semiconductor such as GaAs shows intense interband emission due to electric dipole transition. The difference between the two semiconductors is mainly caused by whether the two selection rules given below are satisfied.

One of the selection rules relates to the wave number, i.e., the requirement that the energy gap should be made smallest at the specified wave number. The other selection rule relates to symmetry of the wave function, i.e., the requirement that, in the wave number that makes the gap minimum, one of the conduction band and the valence band should be an even function and the other should be an odd function.

It should be noted in respect of the selection rule of the symmetry that the intensity of the emission and the absorption between two levels is given by <upper level|transition dipole moment μ|lower level>. In a semiconductor, in which the two levels are represented by the s-orbital (even function) and the p-orbital (odd function) in the vicinity of the atomic orbital, μ denotes an odd function and, thus, the following relation is met, which means to be optically allowed:

$$<s|\mu|p> = \int even \cdot odd \cdot odd \, dr \neq 0.$$

On the other hand, in a semiconductor, in which the two levels are represented by the p-orbital, the following relation is met, which means to be optically forbidden:

$$<p|\mu|p> = \int odd \cdot odd \cdot odd \, dr = 0.$$

In the direct semiconductor, the gap is made minimum at the Γ point so as to satisfy the selection rule of the wave number. In the optical semiconductor, the wave functions of the conduction band and the valence band are expressed by the s-orbital and the p-orbital, respectively, with the result that the selection rule of the symmetry is also satisfied.

On the other hand, in the indirect semiconductor, the conduction band and the valence band differ from each other in the wave number making the gap minimum, resulting in failure to satisfy the selection rule of the wave number. In addition, since the wave function for each of the conduction band and the valence band is represented by the p-orbital, the selection rule of the symmetry is not satisfied either. It follows that the indirect semiconductor is optically forbidden.

(3) FT semiconductor:

As described previously, the FT semiconductor is a theoretic substance that is discovered in 1984 in the process of calculating the conduction band structure of GaAs. Rompa et al., who discovered the theoretic substance, through the band calculation in which the X-point energy is increased in the FT-GaAs obtained by introducing He into the interstitial site of GaAs.

In the present invention, the FT semiconductor structure in which the energy can be controlled at the X-point is applied to an indirect semiconductor such as silicon so as to impart a light emitting function to the indirect semiconductor that is originally unlikely to emit light.

Figure 4C:
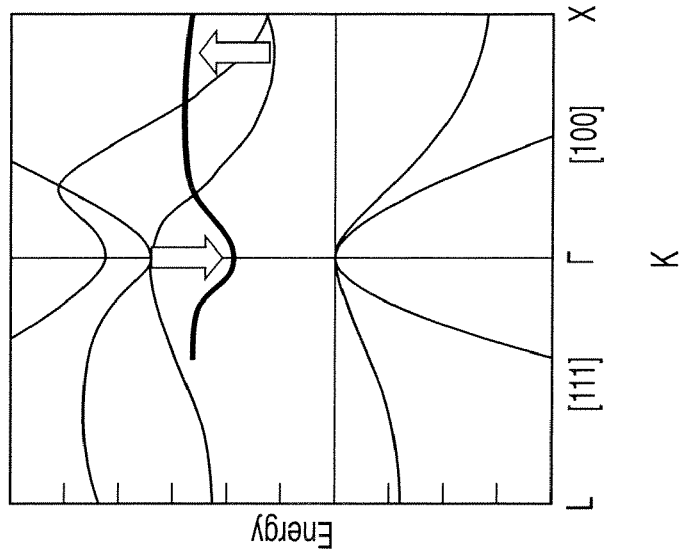
FIGS. 4A, 4B and 4C show band diagrams of a quantum dot, a strain effect and an FT semiconductor, respectively.
Figure 4B:
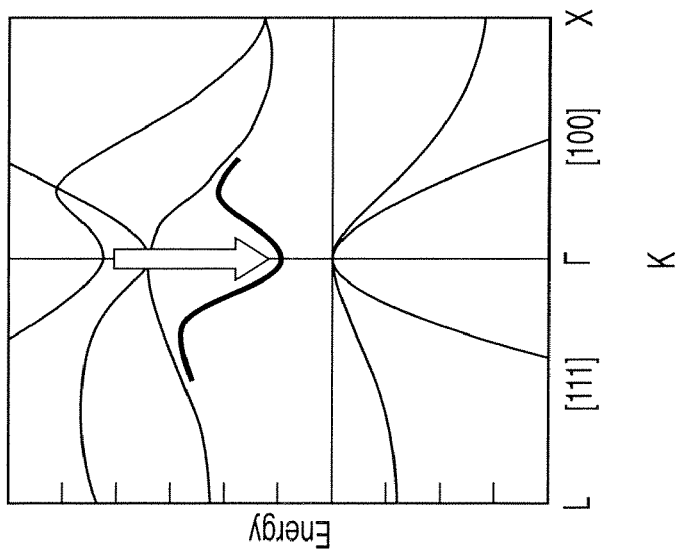
Figure 4A:
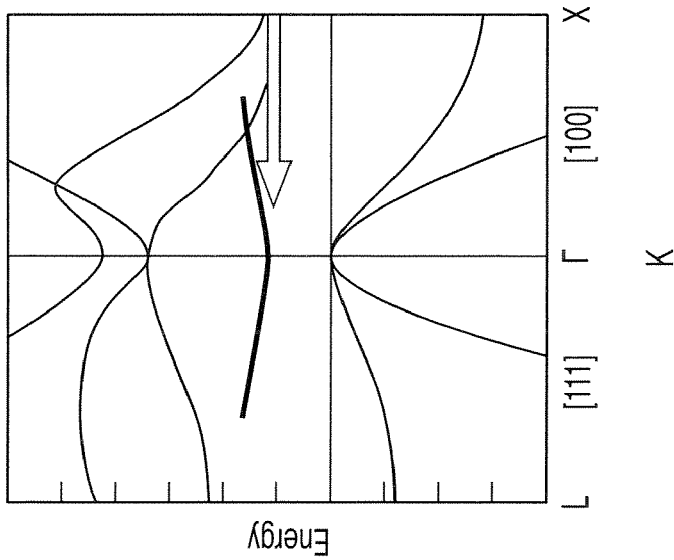

The merits of the FT semiconductor as one of the band engineering methods will be described in comparison with the quantum dot, and the strain effect (tensile effect). FIG. 4A shows the band diagram of a silicon quantum dot, FIG. 4B shows the band diagram of silicon to which 10% isotropic stretching is applied, and FIG. 4C shows the band diagram of FT-silicon.

The quantum dot extends the conduction band (p-orbital) in the vicinity of the X point to the Γ point through the three dimensional confining effect so as to make the gap minimum at the Γ point, thereby changing the band of the quantum dot into a direct band structure. However, even upon receipt of the confining effect, the wave functions of the conduction band and the valence band are not basically changed and remain to be the p-orbital, resulting in failure to satisfy the selection rule of symmetry. In short, the optical characteristics of the quantum dot of the indirect semiconductor are derived from pseudo electric dipole transition where intense emission cannot be expected under its effect alone.

The strain effect (tensile effect) permits the conduction band (s-orbital) positioned above the Γ point to be lowered by increasing the bond length by about 10% so as to modulate the band structure into a direct band structure. The band structure thus obtained is very close to that of the direct semiconductor. The interband transition is electric dipole transition similar to that of a direct semiconductor and, thus, an efficient emission is expected. However, it is considered difficult to stretch the bond length on the order of 10%.

In contrast to the methods described above, the FT semiconductor permits to raise the conduction band (p-orbital) in the vicinity of the X point and to lower the conduction band (s-orbital) at the Γ point, thereby realizing a direct band structure close to that in the case of the direct semiconductor and the strain effect. The interband transition is electric dipole transition and, thus, an efficient emission is expected.

Figure 5A:
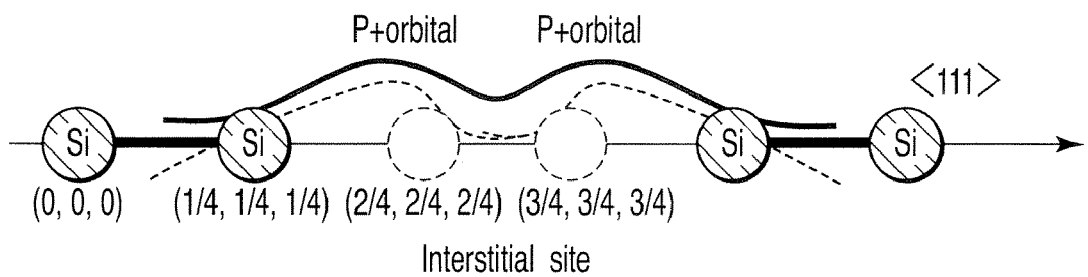
FIGS. 5A, 5B and 5C are diagrams explaining electron states in the real space in respect of the X-point conduction band, the Γ-point conduction band and the Γ-point valence band of the energy bands of silicon.
Figure 5B:
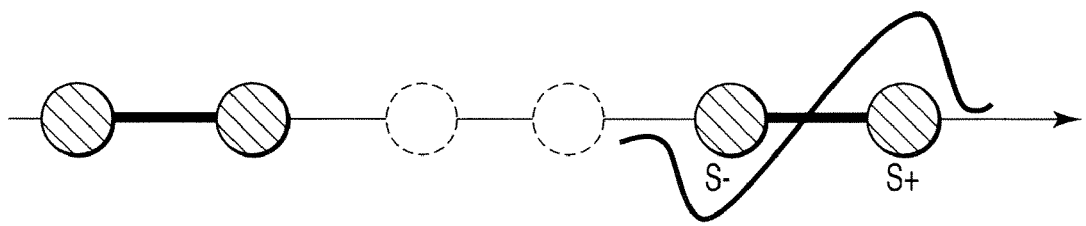
Figure 5C:
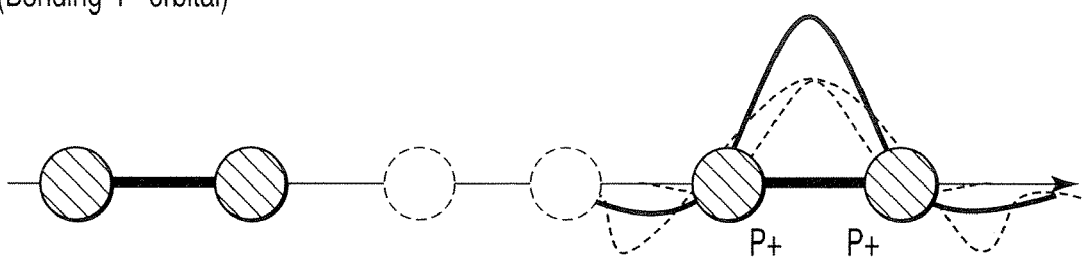

(4) Principle of Emission Mechanism of FT Semiconductor:

FIGS. 5A, 5B and 5C show electron states in the real space in respect of the X point conduction band (Xc), the Γ point conduction band (Γc) and the Γ point valence band (Γv), respectively, in the diamond structure of silicon.

As shown in FIG. 5A, silicon atoms are positioned at the atomic coordinates (0, 0, 0) and (1/4, 1/4, 1/4) as viewed in the direction of the crystal axis <111> and bonded to each other by the Si—Si bond. Interstitial sites that are called tetrahedral sites are arranged at the atomic coordinates (2/4, 2/4, 2/4) and (3/4, 3/4, 3/4). In the tetrahedral structure, a crystal structure having a relatively large clearance is formed such that two atoms are arranged, two interstitial sites are arranged, and two atoms are arranged again along the crystal axis <111>. An atom is not present in the interstitial site. However, since an anti-bonding p-orbital of the silicon atom is expanded toward the interstitial sites, the state of the anti-bonding p-orbital is present in the interstitial sites. "Xc" shown in FIG. 5A denotes the electron state of the interstitial sites.

Figure 6A:
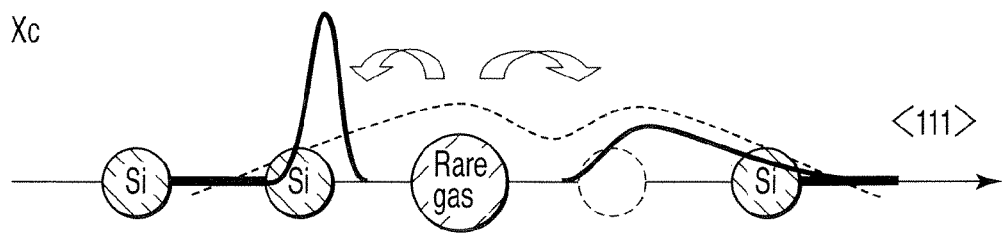
FIGS. 6A, 6B and 6C schematically show change in energy of the X-point conduction band by the FT structure.
Figures 6B, 6C:
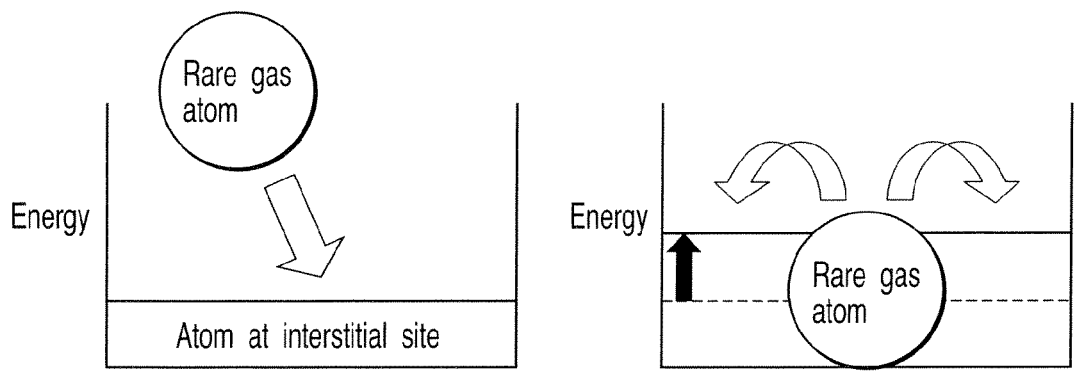

In the FT semiconductor, a rare gas atom (or molecule) of the closed shell structure is introduced into the space of the interstitial site so as to realize the FT structure. In this case, the electron in the interstitial site is excluded, thereby raising the Xc energy as shown in FIG. 4C described above, with the result that the energies of the Γc (anti-bonding s-orbital) and Xc are relatively reversed so as to convert the indirect band structure into a direct structure. FIG. 6A shows that the Xc energy is raised by introducing a rare gas atom into the interstitial site. The particular phenomenon is considered to be close to the phenomenon in which the water level is elevated if a substance is placed in a vessel containing water, as shown in FIGS. 6B and 6C.

If an atom is present in the interstitial site, it is possible that a deep level or a defect level is formed within the band gap. However, since an atom (or molecule) of a closed shell structure having a wide gap is inserted into the interstitial site in the FT structure, such a level is not formed in principle.

Figure 7:
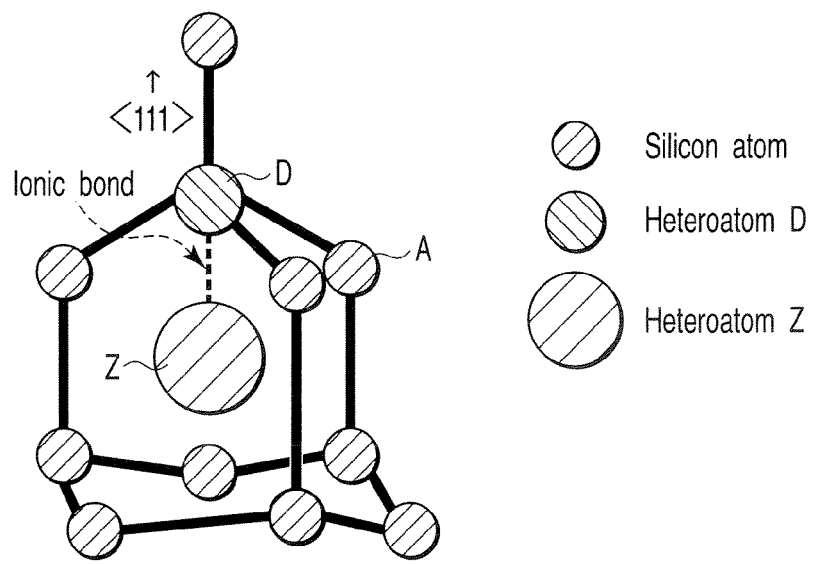
FIG. 7 shows a structure of a pendant type FT semiconductor.

(5) Novel Pendant Type FT Semiconductor:

FIG. 7 shows a bonding state of atoms in a novel FT semiconductor according to one embodiment of the present invention. The novel FT semiconductor is referred to as a pendant type FT semiconductor. The pendant type FT semiconductor constituting the main point of the present invention comprises atoms A of a matrix semiconductor having a tetrahedral structure, a heteroatom D substituted for the atom A in a lattice site, and a heteroatom Z inserted into an interstitial site positioned closest to the heteroatom D. The heteroatom D has a valence electron number differing by +1 or −1 from that of the atom A and can be substituted for the atom A in the lattice site in the tetrahedral structure and to be ionized. The heteroatom Z has an electron configuration of a closed shell structure through charge compensation with the heteroatom D to be ionized. Such being the situation, an ionic bond is formed between the heteroatom D and the heteroatom Z so that the heteroatom D performs a function of pinning the heteroatom Z. The pendant type FT semiconductor of this particular structure permits improving the thermal stability, thereby overcoming the problem inherent in the rare gas-containing or molecule-containing FT semiconductor. This is because, if the heteroatom D and the heteroatom Z are to be pulled away from each other, electrostatic interaction is exerted between the two so as to generate force for maintaining the ionic bond between the two.

FIG. 7 shows a pendant type FT semiconductor in which the atom A forming the matrix semiconductor is silicon, the heteroatom D to be substituted for the atom A in the lattice site is phosphorus (P), and the heteroatom Z to be inserted into the interstitial site closest to the heteroatom D is fluorine (F). The electron configuration of the P atom is $1s^2 2s^2 2p^6 3s^2 3p^3$, and that of the F atom is $1s^2 2s^2 2p^5$. A charge compensation effect is exerted between these two atoms so as to form an ionic $P^+$—$F^-$ bond (PF pair). The $P^+$ ion is substituted for the silicon atom in the lattice point so as to assume a tetrahedral structure and, thus, to be stabilized. The $F^-$ ion becomes to have an electron configuration of a closed shell structure like neon (Ne) and, thus, is also stabilized.

Where a pendant type FT semiconductor is to be realized by using silicon, it is possible to use an n-type or p-type dopant, which has already been used in the actual LSI process, as the heteroatom D to be substituted for the lattice site. This facilitates the manufacture of the pendant type FT semiconductor so as to lower the manufacturing cost thereof.

Figures 8A, 8B, 8C:
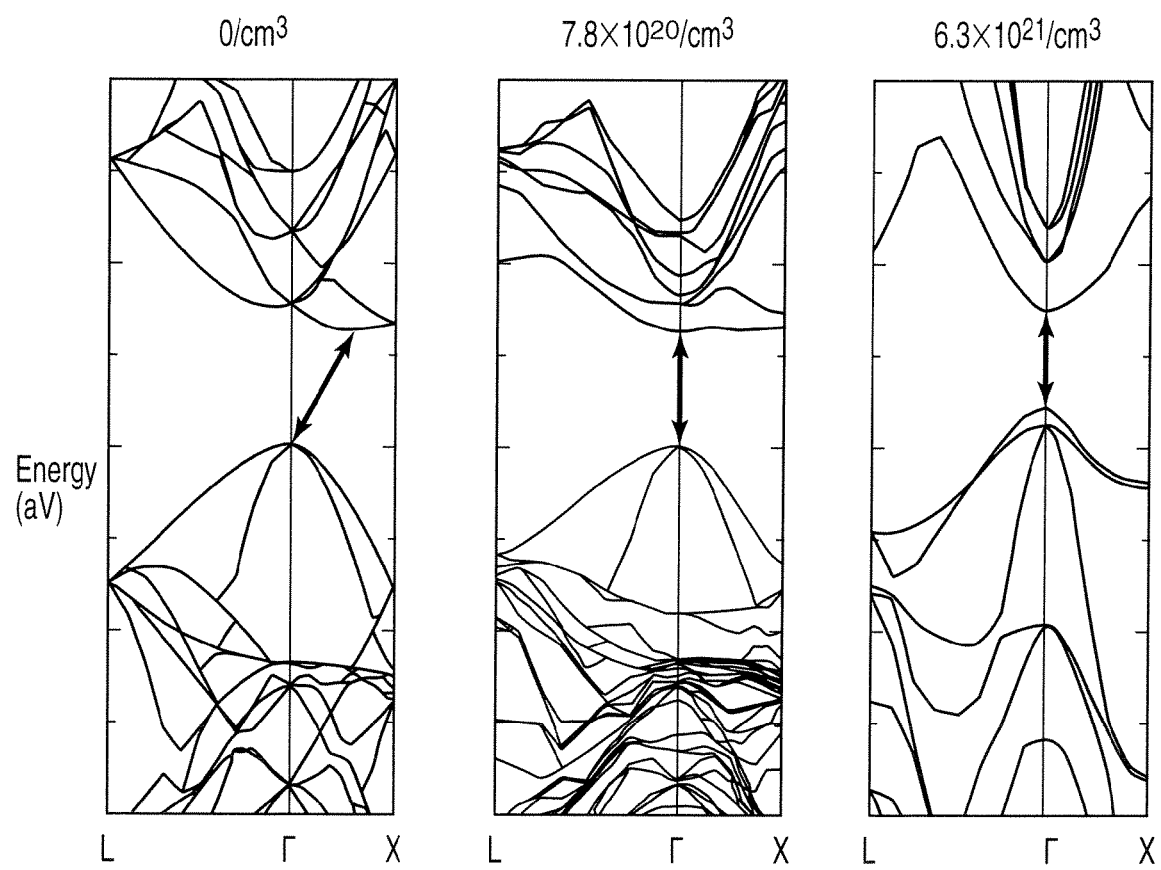
FIGS. 8A, 8B, and 8C show band diagrams of silicon having a PF pair concentration of zero, a pendant type FT-Si having a PF pair concentration of $7.8 \times 10^{20}/cm^3$ and a pendant type FT-Si having a PF pair concentration of $6.3 \times 10^{20}/cm^3$, respectively.

Whether a light emitting function can be imparted to the indirect semiconductor is an important point in the pendant type FT semiconductor according to the embodiments of the present invention, as in the rare gas-containing or the molecule-containing FT semiconductor. FIGS. 8A, 8B and 8C show the results of the band calculation based on the first principle in respect of a PF-doped FT-Si, in which phosphorus (P) is used as the heteroatom D, and fluorine (F) is used as the heteroatom Z. In order to estimate the influence of the PF pair concentration on the band structure, super cells differing from each other in the number of PF pairs relative to the number of Si atoms are used for the calculation. To be more specific, the calculation covered three cases of FIG. 8A where the number of PF pairs is zero relative to 64 Si atoms (the PF concentration is zero, and the Si atom concentration is $5.0 \times 10^{22}/cm^3$), FIG. 8B where the number of PF pairs is 1 relative to 63 Si atoms (the PF concentration is $7.8 \times 10^{20}/cm^3$), and FIG. 8C where the number of PF pairs is 1 relative to 7 Si atoms (the PF concentration is $6.3 \times 10^{21}/cm^3$).

According to the result of the calculation, in the case where the PF pair concentration is zero shown in FIG. 8A, there is the lowest edge of the conduction band in the vicinity of Xc, which indicates an indirect band structure inherent in crystalline silicon. In FIG. 8B in which the PF pair concentration is $7.8 \times 10^{20}/cm^3$, the Xc is scarcely changed, but the Γc is markedly lowered so as to form the lowest edge of the conduction band, with the result that an indirect band structure is appeared locally inside the substance. In FIG. 8C in which the PF pair concentration is $6.3 \times 10^{21}/cm^3$, the Xc is markedly raised so as to cause the entire substance to be changed to have an indirect band structure. These results of the calculation indicate that, where the PF pair concentration is low, the substance locally emits light from the region having the PF pair introduced therein, and that, where the PF concentration is high, the entire substance emits light.

To be more specific, where the PF pair concentration is $7.8 \times 10^{20}/cm^3$ or less, e.g., where only one PF pair is present in the crystal, the lowest edge of the conduction band having the PF pair introduced therein is modulated into the anti-bonding s-orbital. Since the valence band is the bonding p-orbital, the intensity of the emission from the particular site is given by $<s|\mu|p> \neq 0$ as described previously in the section (2). It follows that the FT-Si having the PF concentration of $7.8 \times 10^{20}/cm^3$ or less has a light emitting function.

Also, where the PF pair concentration is $6.3 \times 10^{21}/cm^3$ or more, the region having the PF pair introduced therein is also modulated into the anti-bonding s-orbital. In addition, the orbitals are positioned close to each other in the real space so as to overlap each other, thereby forming a band (Γc). Since the intensity of the emission is also given by the following formula: $<s|\mu|p> \neq 0$, the FT-Si having the PF pair concentration of $6.3 \times 10^{21}/cm^3$ or more also exhibits the light emitting function.

Where the region has an intermediate PF concentration in a range of between $7.8 \times 10^{20}/cm^3$ and $6.3 \times 10^{21}/cm^3$, the lowest edge of the conduction band at the site where the PF pair has been introduced is also modulated into the anti-bonding s-orbital. In the region having the particular PF pair concentration, the s-orbital is gradually allowed to form a band with increase in the PF pair concentration. Since the intensity of the emission is also given by the following formula: $<s|\mu|p> \neq 0$, the FT-Si having the intermediate PF concentration also exhibits the light emitting function like the FT-Si having the other PF concentration.

In conclusion, the pendant type FT semiconductor is considered to produce the effect of imparting the light emitting function to the indirect semiconductor regardless of the DZ pair concentration, like the rare gas-containing or the molecule-containing FT semiconductor.

In the embodiments of the present invention, the combinations of the matrix semiconductor (constituent atom A), the heteroatom D and the heteroatom Z, which are contained in the pendant type FT semiconductor, include the examples given below:

(1) The matrix semiconductor is selected from the group consisting of IVb elemental semiconductors and IVb-IVb compound semiconductors, the heteroatom D is selected from the group consisting of Va elements and Vb elements, and the heteroatom Z is selected from the group consisting of VIIb elements.

(2) The matrix semiconductor is selected from the group consisting of IVb elemental semiconductors and IVb-IVb compound semiconductors, the heteroatom D is selected from the group consisting of IIIa elements and IIIb elements, and the heteroatom Z is selected from the group consisting of Ia elements and Ib elements.

(3) The matrix semiconductor is selected from the group consisting of IIIb-Vb compound semiconductors, the heteroatom D is selected from the group consisting of IVa elements and IVb elements and substituted for the atom A of IIIb, and the heteroatom Z is selected from the group consisting of VIIb elements.

(4) The matrix semiconductor is selected from the group consisting of IIIb-Vb compound semiconductors, the heteroatom D is selected from the group consisting of IIa elements and IIb elements and substituted for the atom A of IIIb, and the heteroatom Z is selected from the group consisting of Ia elements and Ib elements.

(5) The matrix semiconductor is selected from the group consisting of IIIb-Vb compound semiconductors, the heteroatom D is selected from the group consisting of VIa elements and VIb elements and substituted for the atom A of Vb, and the heteroatom Z is selected from the group consisting of VIIb elements.

(6) The matrix semiconductor is selected from the group consisting of IIIb-Vb compound semiconductors, the heteroatom D is selected from the group consisting of IVa elements and IVb elements and substituted for the atom A of Vb, and the heteroatom Z is selected from the group consisting of Ia elements and Ib elements.

The matrix semiconductor can be exemplified as follows. Specifically, the IVb elemental semiconductor is selected from the group consisting of diamond, silicon and germanium. The IVb-IVb compound semiconductor is selected from the group consisting of SiC, GeC, $Si_xGe_{1-x}$ ($0<x<1$) and $Si_xGe_yC_{1-x-y}$ ($0<x<1$, $0<y<1$, $0<x+y<1$). The IIIb-Vb compound semiconductor is selected from the group consisting of BN, BP, AlP, AlAs, AlSb and GaP.

The heteroatom D and the heteroatom Z can be exemplified as follows. Specifically, the Ia element is selected from the group consisting of Li, Na, K, Rb and Cs. The IIa element is selected from the group consisting of Be, Mg, Ca, Sr, and Ba. The IIIa element is selected from the group consisting of Sc, Y, La and Lu. The IVa element is selected from the group consisting of Ti, Zr and Hf. The Va element is selected from the group consisting of V, Nb and Ta. The VIa element is selected from the group consisting of Cr, Mo and W. The Ib element is selected from the group consisting of Cu, Ag, and Au. The IIb element is selected from the group consisting of Zn, Cd, and Hg. The IIIb element is selected from the group consisting of B, Al, Ga, In and Tl. The IVb element is selected from the group consisting of C, Si, Ge, Sn and Pb. The Vb element is selected from the group consisting of N, P, As, Sb, and Bi. The VIb element is selected from the group consisting of O, S, Se and Te. The VIIb element is selected from the group consisting of F, Cl, Br and I.

Figure 9A:
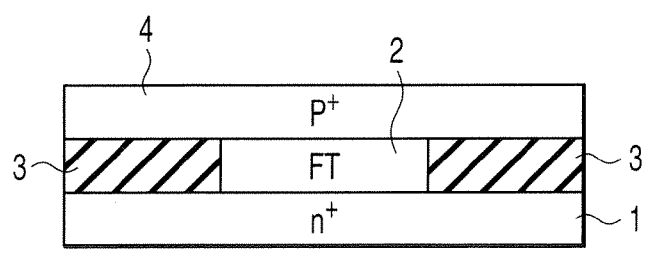
FIGS. 9A and 9B are cross-sectional views showing the structures of silicon light emitting devices of a vertical type and a lateral type, respectively, according to embodiments.
Figure 9B:
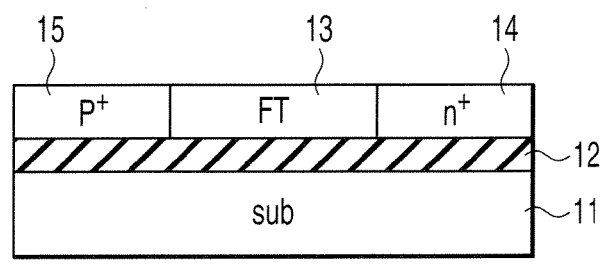

The light emitting device according to an embodiment of the present invention comprises an active layer having an FT structure, and an n-electrode and a p-electrode for exciting the active layer. The positions of the n-electrode and the p-electrode relative to the active layer having the FT structure are not particularly limited. FIGS. 9A and 9B are cross-sectional views each showing the structure of a silicon light emitting device according to an embodiment of the present invention.

In the light emitting device of the vertical type shown in FIG. 9A, an active layer 2 having an FT structure and an insulating film 3 are formed on an $n^+$ region 1, and a $p^+$ region 4 is formed on the active layer 2 and the insulating film 3. In other words, the lower and upper surfaces of the active layer 2 are in contact with the $n^+$ region 1 and the $p^+$ region 4, respectively. An n-electrode (not shown) is connected to the $n^+$ region 1, and a p-electrode (not shown) is connected to the $p^+$ region 4. In this light emitting device, a current flows in the vertical direction so as to permit electrons to be injected from the $n^+$ region 1 into the active layer 2 and to permit holes to be injected from the $p^+$ region 4 into the active layer 2, with the result that the electrons and the holes are recombined within the active layer 2 of the FT structure having a direct band structure so as to emit light.

In the light emitting device of a lateral type shown in FIG. 9B, a buried oxide film 12 is formed in a semi-insulating silicon substrate 11, and an $n^+$ region 14 and a $p^+$ region 15 are formed on the same plane on the oxide film 12 in a manner to have an active layer 13 of the FT structure sandwiched therebetween. An n-electrode (not shown) is connected to the $n^+$ region 14, and a p-electrode (not shown) is connected to the $p^+$ region 15. In the light emitting device shown in FIG. 9B, a current flows in the lateral direction so as to permit the electrons to be injected from the $n^+$ region 14 into the active layer 13 and to permit the holes to be injected from the $p^+$ region 15 into the active layer 13, with the result that the electrons and the holes are recombined within the active layer 13 of the FT structure having a direct band structure so as to emit light.

In the light emitting device of each of the vertical type and the lateral type, a buried oxide film is formed for preventing the current leakage. However, it is not absolutely necessary to form the buried oxide film in the case where the current leakage can be prevented by any of the element structure, the substrate resistivity and the circuit structure.

Each of FIGS. 9A and 9B shows the basic structure of the light emitting device, and various structures of the specific light emitting device are conceivable. For example, in the light emitting device according to an embodiment of the present invention, it is possible for the emitted light to be taken out from the edge surface or from the upper surface of the active layer. Where the emitted light is taken out from the upper surface of the active layer, a transparent electrode may be formed on the upper surface of the active layer. It is also possible to use an optical resonator of a pair of mirror surfaces, i.e., a pair of a low-reflectance mirror surface and a high-reflectance mirror surface, which are formed to have the active layer sandwiched therebetween, so as to cause a laser oscillation. It is also possible to combine these structures appropriately. Further, a light emitting device array can be manufactured by forming a plurality of light emitting devices integrally on the same substrate. A photoelectric device array can be manufactured by forming a light emitting device and a transistor integrally on the same substrate. A light emitting-detecting device array can be manufactured by forming a light emitting device and a photodetection device integrally on the same substrate. An optical device array can be manufactured by forming a light emitting device, a photodetection device and a waveguide connecting these light emitting device and photodetection device integrally on the same substrate. These modifications will be described herein later in detail.

The method of forming an active layer having an FT structure will now be described with reference to FIGS. 10A, 10B, 10C and 10D. The following description covers the case of forming an active layer of PF-doped FT-Si.

Figure 10A:
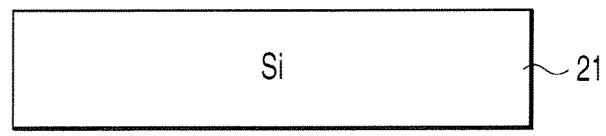
FIGS. 10A, 10B, 10C and 10D are cross-sectional views showing a method of forming an active layer of a PF-doped FT-Si according to an embodiment.
Figure 10B:
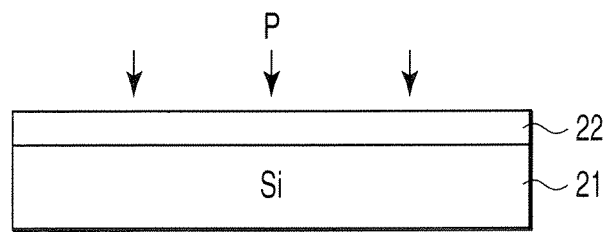

In the first step, a Si wafer 21 is prepared as shown in FIG. 10A, followed by doping a prescribed doping region 22 of the Si wafer 21 with phosphorus (P) as a heteroatom D, as shown in FIG. 10B. Phosphorus (P) performs the function of an n-type dopant.

Figure 10C:
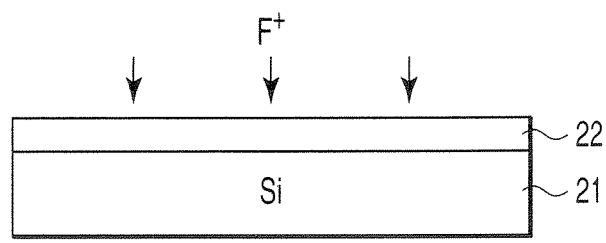

In the next step, fluorine ($F^+$) as a heteroatom Z is ion-implanted into the prescribed doping region 22 of the Si wafer 21 already doped with P, as shown in FIG. 10C. In this ion implantation process, the energy, the dose, the orientation of the substrate surface, the tilted angle, the substrate temperature, and so forth are made optimum. The $F^+$ ion, which is originally an active ion species, receives an excessive electron owned by the P atom and an electron supplied from the ground through the substrate to be in an $F^-$ ion, thereby forming a closed shell structure like the neon (Ne) atom and being inactivated chemically.

Figure 10D:
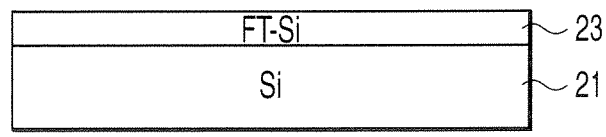

In the step shown in FIG. 10D, annealing is carried out so as to recrystallize the lattice disturbed by the ion implantation, thereby forming an active layer 23 consisting of FT-Si. In this annealing process, the silicon atom in the lattice point can be replaced by the P atom and the F atom can be inserted into the interstitial site by controlling the annealing temperature, the annealing time, the atmosphere and so forth. The P atom is positioned in the lattice point. However, since the P atom is deprived of an electron by the F atom, the active layer 23 is made electrically inactive and, thus, the resistivity of the active layer 23 is increased. The P atom and the F atom are bonded to each other by an ionic bond and are not dissociated even by a temperature elevation accompanying the annealing treatment, so as to maintain the paired state.

Further, the other steps are carried out so as to manufacture the light emitting device constructed as shown in FIG. 9A or 9B.

As described above, an active layer having an FT structure can be formed within a matrix semiconductor by the method employing the ion implantation and the annealing in combination. Incidentally, it is also possible to form the active layer having the FT structure by the combination of a thermal diffusion and the annealing. Further, the active layer having the FT structure can be formed by employing other methods.

If the heteroatom D at the lattice point is bonded to the heteroatom Z in the interstitial site like the PF pair, another inherent vibration mode differing from the lattice vibration of the matrix semiconductor is generated. As a result, it is possible to analyze directly the FT structure from infrared spectroscopy or Raman spectroscopy. When it comes to an example of the PF pair, the calculation of the standard vibration indicates that a vibration mode appears in the vicinity of the wave number of 150 to 200 $cm^{-1}$. In this fashion, evaluation of the vibration mode provides one of effective means of examining the presence of the FT structure.

As an indirect and simple method of detecting the presence of the DZ pair, it is possible to employ an electrical measurement such as resistance measurement or Hall measurement. In the case of using an n-type or p-type dopant as the heteroatom D substituted for the lattice point, the substrate before doping the heteroatom Z in the interstitial site exhibits an n-type or p-type and, thus, has a low resistivity. If the heteroatom D is paired with the heteroatom Z, the free carrier is decreased by the charge compensation between the heteroatom Z and the heteroatom Z so as to increase the resistivity of the substrate. Thus, it is possible to detect whether the DZ pair has been formed by comparing the resistances or the carrier concentrations before and after the doping of the heteroatom Z.

It is also possible to pulverize the pendant type FT semiconductor according to an embodiment of the present invention so as to use the pulverized FT semiconductor as a phosphor. The combinations of the matrix semiconductor (constituent atom A), the heteroatom D and the heteroatom Z of the phosphor are as described previously in conjunction with the active layer.

The present invention will be described in more detail with reference to specific embodiments.

FIRST EMBODIMENT

A silicon light emitting device of the vertical type, which is constructed as shown in FIG. 9A, will be described. The PF doped FT-Si active layer is formed by using silicon as the matrix semiconductor, the P atom as the heteroatom D substituted for the lattice site, and the F atom as the heteroatom Z inserted into the interstitial site. The PF pair concentration is $2.5 \times 10^{20}/cm^3$. The concentration of each of the P atoms and the F atoms can be confirmed by SIMS.

For examining whether a PF pair of a pendant type FT structure is formed in the active layer, it is effective to examine the vibration mode inherent in the PF pair, and the PF pair can be detected by the microspectroscopy of the active layer. As a method of easily checking the PF pair formation, it is possible to prepare a PF-doped region having a composition equal to that of the active layer and a region doped with P alone on the surface of a substrate having a high resistivity so as to compare these two doped regions in respect of the sheet resistance or the carrier concentration. If a PF pair is formed, the charge compensation is caused so as to increase the resistivity and decrease the carrier concentration of the PF-doped region, compared with the region doped with P alone.

If the PF-doped FT-Si in the active layer is excited with light, PL emission is generated in the wavelength region corresponding to the band gap of the crystalline silicon. As apparent from the result of the band calculation shown in FIGS. 8A and 8B, the band gap of the PF-doped FT-Si is substantially equal to that of the crystalline silicon. Therefore, the PL emission wavelength is not contradictory to the emission wavelength expected from the result of the calculation described above. It follows that an FT-Si is considered to be formed in the active layer so as to change the active layer into a direct band structure.

If the light emitting device is driven by a current so as to permit holes to be injected from the $p^+$ region into the active layer and to permit electrons to be injected from the $n^+$ region into the active layer, it is possible to bring about a recombination radiation excited with current.

As described above, the pendant type FT semiconductor for modulating the energy band into a direct structure is highly effective as a band engineering method for imparting a light emitting function to the indirect semiconductor.

COMPARATIVE EXAMPLE

Described in the following is an element exactly equal in structure to the first embodiment, except that the B atom is used in place of the F atom as the heteroatom Z inserted into the interstitial site in the active layer. The B concentration is set at $2.5 \times 10^{20}/cm^3$, which is equal to the F concentration in the first embodiment.

The element of the Comparative Example is non-emissive even if a current is applied thereto. Also, the element of the Comparative Example is non-emissive even if the active layer is excited with light.

The reason why the element of the Comparative Example is non-emissive is due to the position of the B atom in the crystal. As widely known to the art, the B atom is a typical p-type dopant and is positioned at the lattice site, not at the interstitial site. As a result, the B atom and the P atom perform charge compensation so as to increase the resistivity of the active layer. However, the pendant type FT structure is not formed.

As described above, in order to form a pendant type FT structure and to induce a direct band structure in the matrix semiconductor, it is necessary to select the heteroatoms with a sufficient attention paid to the combination of the heteroatom substituted for the lattice site and the heteroatom inserted into the interstitial site.

SECOND EMBODIMENT

A light emitting device of the structure equal to that of the first embodiment is prepared except that the B atom of a p-type dopant is used as the heteroatom D and the K atom is used as the heteroatom Z. Each of the B concentration and the K concentration as determined by SIMS is $5 \times 10^{20}/cm^3$, and the BK pair concentration is estimated at $5 \times 10^{20}/cm^3$.

When the light emitting device is excited with light, PL emission is caused at the wavelength in the vicinity of the band gap of the crystalline silicon. When the element is driven with current, it is possible to bring about a current injection radiation from the region of the FT structure in the active layer. The emission wavelength is also equal to the wavelength in the vicinity of the band gap of the crystalline silicon, and the emitted light exhibits emission spectrum of a shape resembling the PL emission spectrum.

As apparent from the second embodiment, the light emitting function can be imparted to the indirect semiconductor even in the case where the heteroatom D and the heteroatom Z represent a combination of a IIIb element and a Ia element.

THIRD EMBODIMENT

Light emitting devices are manufactured as in the first embodiment by using various materials as the matrix semiconductor, the heteroatom D at the lattice site and the heteroatom Z at the interstitial site.

Table 1 shows (1) the matrix semiconductor in the active layer, (2) the lattice site substituted by the heteroatom D, (3) the heteroatom D substituted for the lattice site, (4) the heteroatom Z inserted into the interstitial site, (5) the DZ pair concentration estimated from the Z concentration, and (6) the emission peak wavelength through current injection.

As shown in Table 1, emission through the current injection is caused even in compound indirect semiconductors by introducing a pendant type FT structure into the compound-based indirect semiconductor.

TABLE 1

| (1) Matrix semiconductor | (2) Lattice site substituted by D (group) | (3) D (group) | (4) Z (group) | (5) DZ pair concentration (/cm$^3$) | (6) Emission wavelength (nm) |
|---|---|---|---|---|---|
| AlP | P (15) | Si (14) | Na (1) | 1.5E+20 | 515 |
| GaP | Ga (13) | Mg (2) | Na (1) | 2.1E+20 | 560 |
| GaP | Ga (13) | Si (14) | F (17) | 1.4E+20 | 560 |
| GaP | Ga (13) | Mg (2) | K (1) | 4.4E+20 | 565 |
| GaP | Ga (13) | Zn (12) | Na (1) | 3.6E+20 | 565 |
| GaP | P (15) | Se (16) | F (17) | 8.8E+19 | 565 |
| GaP | P (15) | S (16) | F (17) | 1.18E+20 | 570 |
| GaP | P (15) | S (16) | Cl (17) | 9.7E+19 | 570 |
| AlSb | Sb (15) | Se (16) | F (17) | 6.2E+20 | 785 |
| AlSb | Sb (15) | Te (16) | F (17) | 5.1E+20 | 790 |

FOURTH EMBODIMENT

A silicon light emitting device of the lateral type, which is constructed as shown in FIG. 9B, will be explained. Specifically, a PF-doped FT-Si active layer is formed by using silicon as the matrix semiconductor, the P atom as the heteroatom D substituted for the lattice site, and the F atom as the heteroatom Z inserted into the interstitial site. The PF pair concentration is $4.6 \times 10^{20}/cm^3$. The concentration of each of P atoms and the F atoms is confirmed by SIMS.

For examining whether the PF pair of the pendant type FT structure is formed in the active layer, it is effective to examine the vibration mode inherent in the PF pair. Also, the PF pair formation can be detected for convenience from the resistance value or the carrier concentration.

When the light emitting device is driven with current, it is possible to permit emission through the current injection to be generated from the region of the FT structure in the active layer. The emission is generated in the vicinity of the band gap of the crystalline silicon.

As described above, it is possible to permit the light emitting device having the FT structure introduced therein to cause emission through current injection by the lateral current driving as in the case of the vertical current driving.

FIFTH EMBODIMENT

Figure 11A:
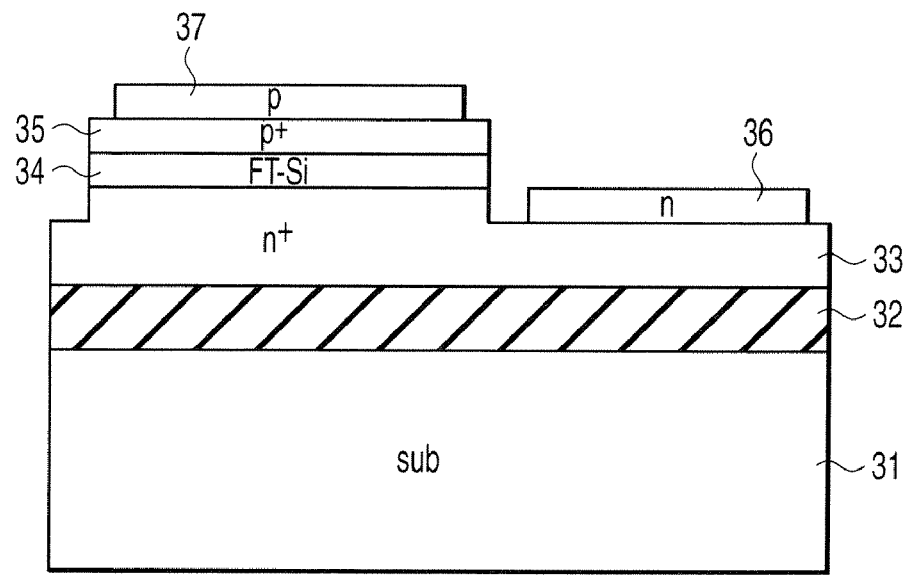
FIGS. 11A and 11B are a cross-sectional view and a perspective view, respectively, showing a structure of a silicon light emitting device of an edge surface emission type according to the fifth embodiment.
Figure 11B:
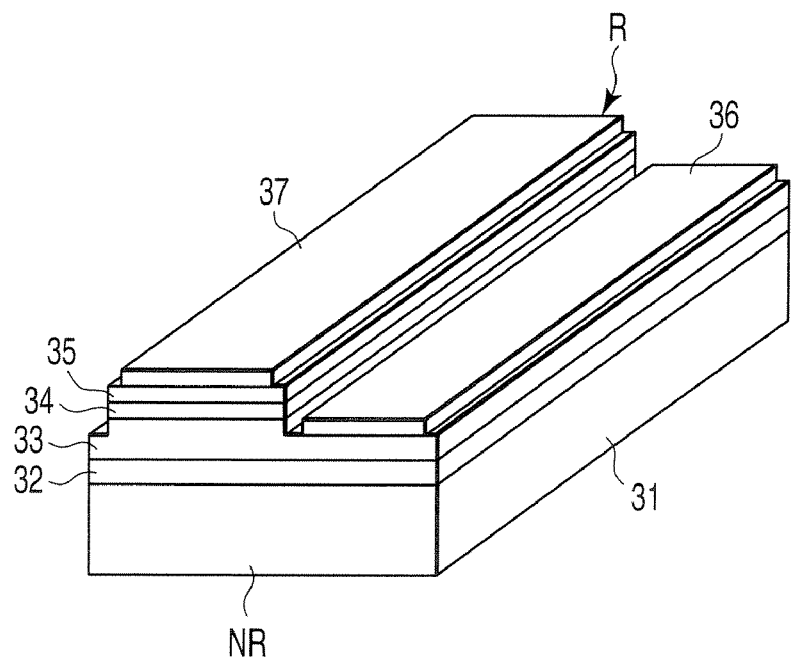

FIGS. 11A and 11B are a cross-sectional view and a perspective view, respectively, showing the structure of the silicon light emitting device of an edge surface emission type according to this embodiment. A buried oxide film 32 is formed within a semi-insulating silicon substrate 31. An n$^+$ region 33 doped with P, an active layer 34 of an FT-Si, and a p$^+$ region 35 doped with B are formed on the upper surface of the buried oxide film 32. The active layer 34 consists of the PF-doped FT-Si in which a matrix silicon layer is doped with the P atom used as the heteroatom D substituted for the lattice site and with the F atom used as the heteroatom Z inserted into the interstitial site. The PF pair concentration is about $3 \times 10^{20}/cm^3$. The p$^+$ region 35, the active layer 34 and the n$^+$ region 33 are partly etched, and an n-electrode 36 connected to the n$^+$ region 33 and a p-electrode 37 connected to the p$^+$ region 35 are formed. Each of the n-electrode 36 and the p-electrode 37 is formed of Ni silicide/Au. As shown in FIG. 11B, one edge surface of the light emitting device is coated with a non-reflective film NR, and the other edge surface is coated with a reflective film R. In the structure, emission through current injection can be achieved efficiently from the edge surface coated with the non-reflective film NR.

Figure 12:
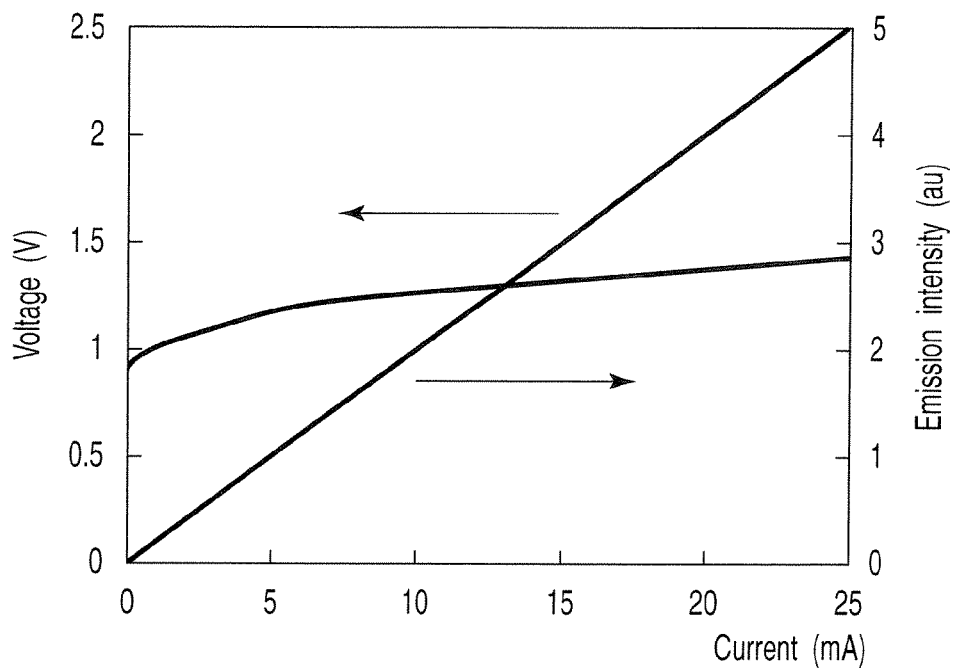
FIG. 12 is a graph showing a relationship among a current, voltage and emission intensity of the silicon light emitting device according to the fifth embodiment.

When the light emitting device is driven with current, the emission through current injection radiation is caused. FIG. 12 is a graph showing the relationship among the current, voltage and the emission intensity.

As described above, it is possible to manufacture a silicon light emitting device of the edge surface emission type having the FT structure introduced therein and to permit the light emitting device to generate the emission through the current injection.

SIXTH EMBODIMENT

Figure 13A:
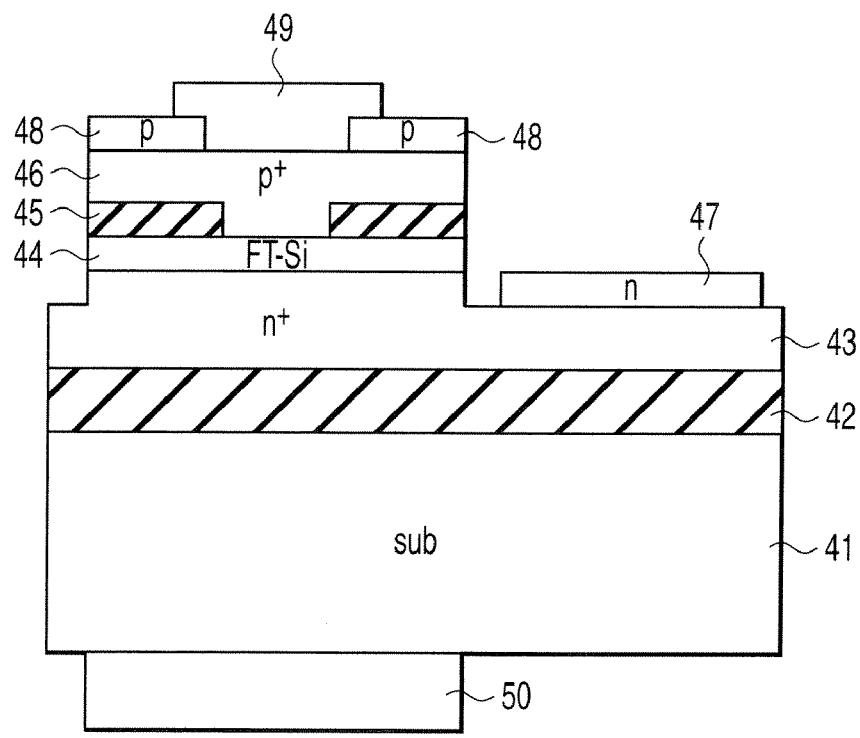
FIGS. 13A and 13B are a cross-sectional view and a perspective view, respectively, showing a structure of a silicon light emitting device of a surface emission type according to the sixth embodiment.
Figure 13B:
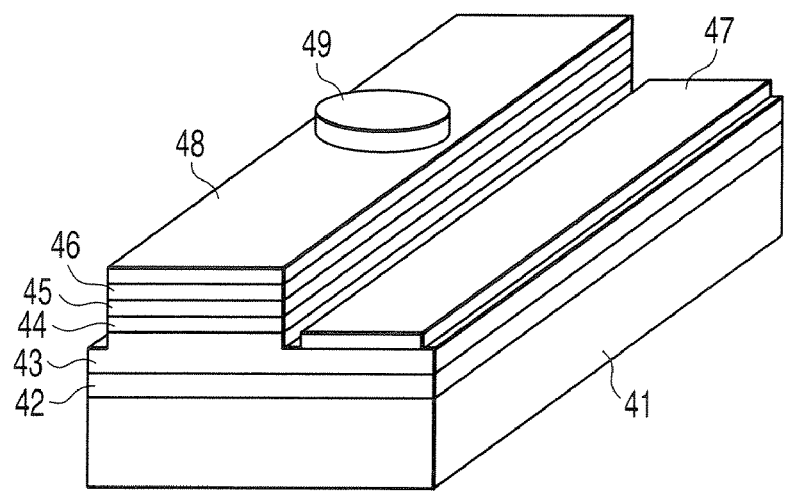

FIGS. 13A and 13B are a cross-sectional view and a perspective view, respectively, showing the structure of the silicon light emitting device of a surface emission type according to this embodiment. A buried oxide film 42 is formed within a semi-insulating silicon substrate 41. An n$^+$ region 43 doped with P and an active layer 44 consisting of FT-Si are formed on the upper surface of the buried oxide film 42. The active layer 44 consists of PF-doped FT-Si in which a matrix silicon layer is doped with the P atom used as the heteroatom D substituted for the lattice site and with the F atom used as the heteroatom Z inserted into the interstitial site. The PF pair concentration is about $7 \times 10^{20}/cm^3$. An insulating layer 45 is formed selectively on the upper surface of the active layer 44, and a p$^+$ region 46 doped with B is formed to cover the insulating layer 45. The p$^+$ region 46, the insulating layer 45, the active layer 44 and the n$^+$ region 43 are partly etched, and an n-electrode 47 connected to the n$^+$ region 43 and a p-electrode 48 connected to the p⁺ region 46 are formed. The p-electrode 48 is arranged above the insulating layer 45. Each of the n-electrode 47 and the p-electrode 48 is formed of Ni silicide/Au. In the light emitting device in this embodiment, EL emission is taken out from the upper surface through the p⁺ region 46. Therefore, the light emitting device is designed to diminish or eliminate substantially completely the overlap between the active layer 44 and the p-electrode 48 as viewed from the surface so as to prevent the active layer 44 from being concealed by the p-electrode 48. A non-reflective film 49 is formed on the p⁺ region 48 on the front surface, and a reflective film 50 is formed on the rear surface of the substrate 41. Each of the edge surfaces of the light emitting device is coated with a reflective film. In the structure shown in the drawings, emission through current injection can be achieved efficiently from the non-reflective film 49 on the side of the front surface.

Figure 14:
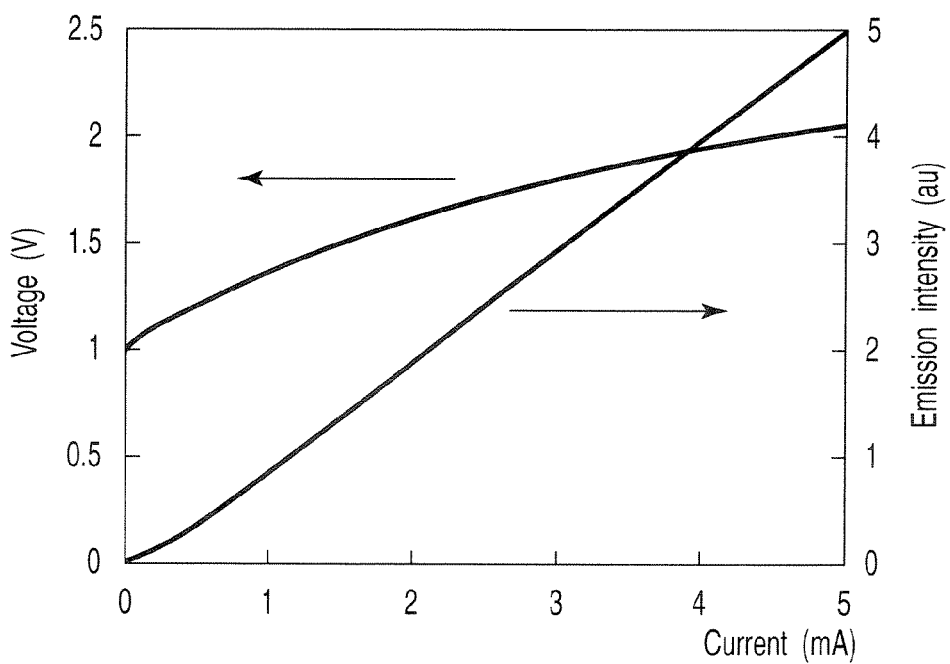
FIG. 14 is a graph showing a relationship among a current, voltage and emission intensity of the silicon light emitting device according to the sixth embodiment.

When the light emitting device is driven with current, electrons and holes are recombined within the active layer 44 consisting of the FT-Si so as to generate emission through the current injection. FIG. 14 is a graph showing the relationship among the current, the voltage and the emission intensity.

As described above, it is possible to manufacture a silicon light emitting device of the surface emission type having the FT structure introduced therein and to permit the light emitting device to generate the emission through the current injection.

SEVENTH EMBODIMENT

Figure 15:
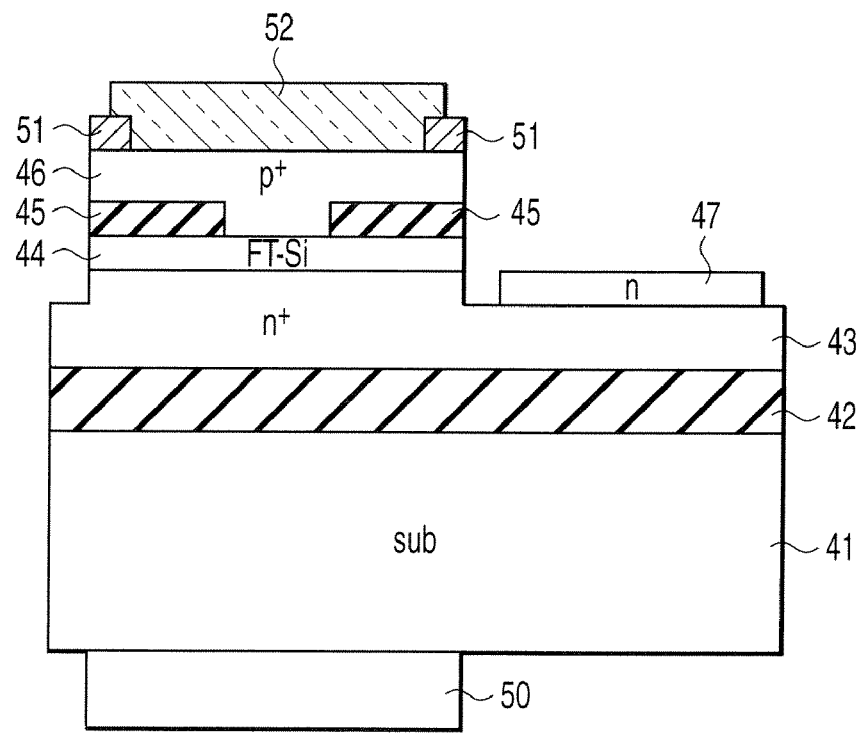
FIGS. 15A and 15B are a cross-sectional view and a perspective view, respectively, showing a structure of a silicon light emitting device of a surface emission type according to the seventh embodiment.
Figure 15:
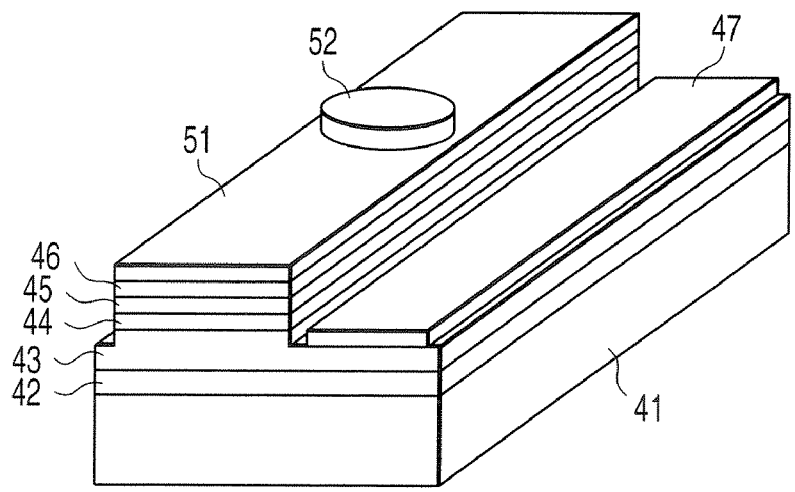

FIGS. 15A and 15B are a cross-sectional view and a perspective view, respectively, showing the structure of the silicon light emitting device of a surface emission type according to this embodiment. This light emitting device is substantially equal to the light emitting device of the sixth embodiment, except that an auxiliary electrode 51 and a transparent electrode 52 are formed in place of the non-reflective film 49.

When the light emitting device is driven with current, electrons and holes are recombined within the active layer 44 consisting of an FT-Si so as to generate emission through current injection. FIG. 16 is a graph showing the relationship among the current, the voltage and the emission efficiency.

As described above, it is possible to manufacture a silicon light emitting device of the surface emission type by introducing an FT structure and using a transparent electrode and to permit the light emitting device to generate the emission through the current injection.

EIGHTH EMBODIMENT

Figure 17A:
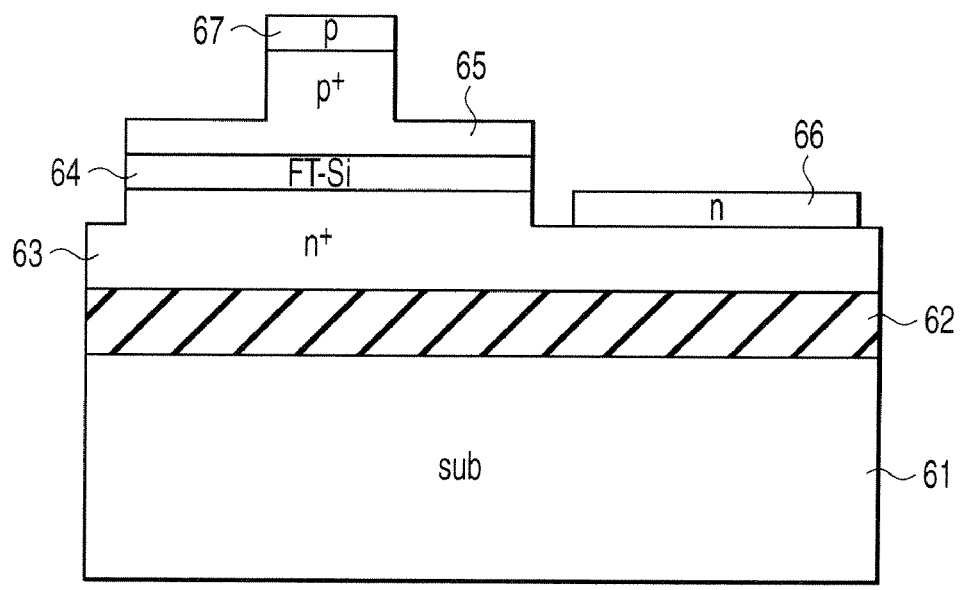
FIGS. 17A and 17B are a cross-sectional view and a perspective view, respectively, showing a structure of an LD device of an edge surface emission type according to the eighth embodiment.
Figure 17B:
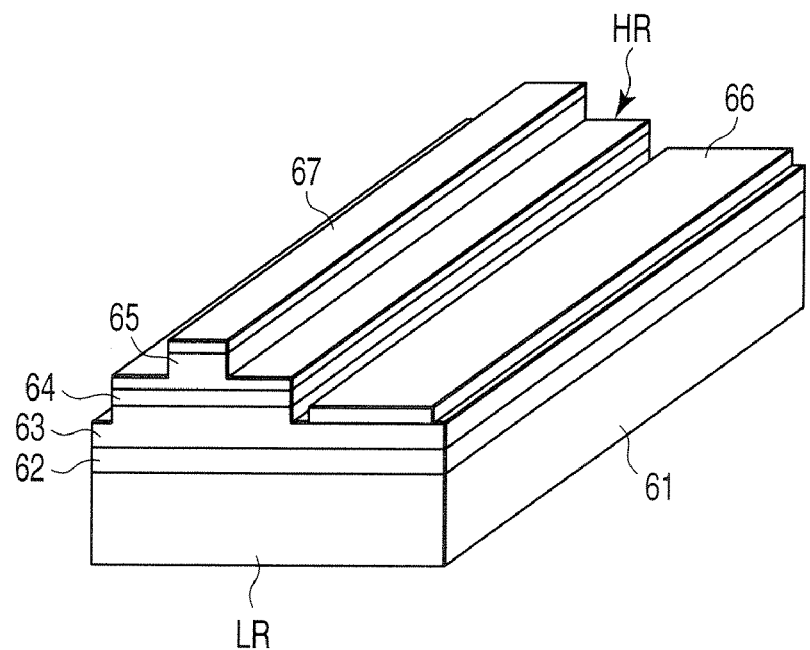

FIGS. 17A and 17B are a cross-sectional view and a perspective view, respectively, showing the structure of the laser diode (herein after referred to as "LD device") of an edge surface emission type according to this embodiment. The LD device is an edge surface light emitting device having a ridge waveguide structure. A buried oxide film 62 is formed within a semi-insulating silicon substrate 61. An n⁺ region 63 doped with P, an active layer 64 consisting of FT-Si, and a p⁺ region 65 doped with B are formed on the upper surface of the buried oxide film 62. The active layer 64 consists of PF-doped FT-Si having the P atom doped as a heteroatom D for the lattice site and the F atom doped as a heteroatom Z at the interstitial site. The PF pair concentration is about $1 \times 10^{21}/cm^3$. The p⁺ region 65, the active layer 64 and the n⁺ region 63 are partly etched, and an n-electrode 66 connected to the n⁺ region 63 and a p-electrode 67 connected to the p⁺ region 65 are formed. Further, the p-electrode 67 and the p⁺ region 65 are partly etched. Each of the n-electrode 66 and the p-electrode 67 is formed of Ni silicide/Au. As shown in FIG. 17B, a dielectric multi-layered mirror LR having a low reflectance is formed on one edge surface of the LD device, and a dielectric multi-layered mirror HR having a high reflectance is formed on the other edge surface of the LD device.

When the LD device is driven with current, it is possible that laser light is oscillated from the edge surface. FIG. 18 is a graph showing the relationship between the current and the emission intensity. If the emission spectrum generated by the current injection is examined, it is found that the spectrum is broad under a current lower than the threshold current, but is made sharp and monochromatic under a current higher than the threshold current, though the particular change in the spectrum is not shown in the drawing. The particular change in the spectrum indicates that it is possible to generate a continuous laser oscillation under a current higher than the threshold current.

Various materials other than those described above can be used as the FT semiconductor materials constituting the active layer. For example, it is possible to use the B atom as the heteroatom D and the K atom as the heteroatom Z in combination with Si used as the matrix semiconductor. It is also possible to use various combinations of the materials described previously.

NINTH EMBODIMENT

FIGS. 19A and 19B are a cross-sectional view and a perspective view, respectively, showing the structure of the surface emission type LD device according to this embodiment. A buried oxide film 72 is formed within a semi-insulating silicon substrate 71. An n⁺ region 73 doped with P and an active layer 74 consisting of an FT-Si are formed on the upper surface of the buried oxide film 72. The active layer 74 is formed of PF-doped FT-Si having the P atom doped at the lattice site as the heteroatom D and having the F atom doped at the interstitial site as the heteroatom Z. The PF pair concentration is about $7 \times 10^{20}/cm^3$. An insulating film 75 is formed selectively on the upper surface of the active layer 74, and a p⁺ region 76 doped with B is formed to cover the insulating layer 75. The p⁺ region 76, the insulating film 75, the active layer 74 and the n⁺ region 73 are partly etched, and an n-electrode 77 connected to the n⁺ region 73 and a p-electrode 78 connected to the p⁺ region 76 are formed. Each of the n-electrode 78 and the p-electrode 78 is formed of Ni silicide/Au. The p-electrode 78 is partly etched, and a dielectric multi-layered mirror 79 of a low reflectance is formed. A dielectric multi-layered mirror 80 of a high reflectance is formed on the rear surface of the substrate 71 in a manner to correspond to the dielectric multi-layered mirror 79 of a low reflectance.

Figure 20:
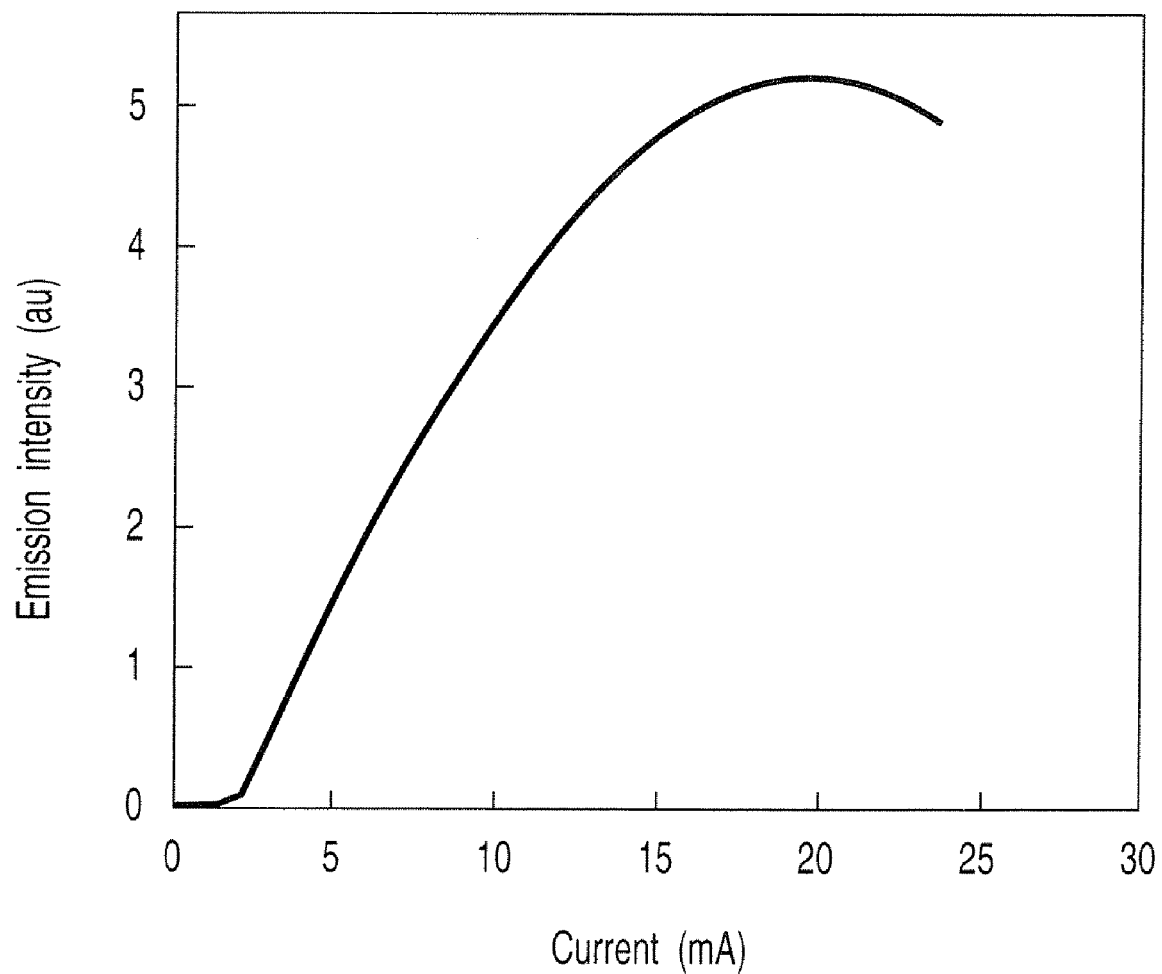
FIG. 20 is a graph showing a relationship between a current and emission intensity of the LD device according to the ninth embodiment.

When the LD device is driven with current, it is possible to permit laser light to be oscillated from the surface. FIG. 20 is a graph showing the relationship between the current and the emission intensity. Laser oscillation can be generated continuously under a current higher than the threshold current shown in FIG. 20.

TENTH EMBODIMENT

Figure 21:
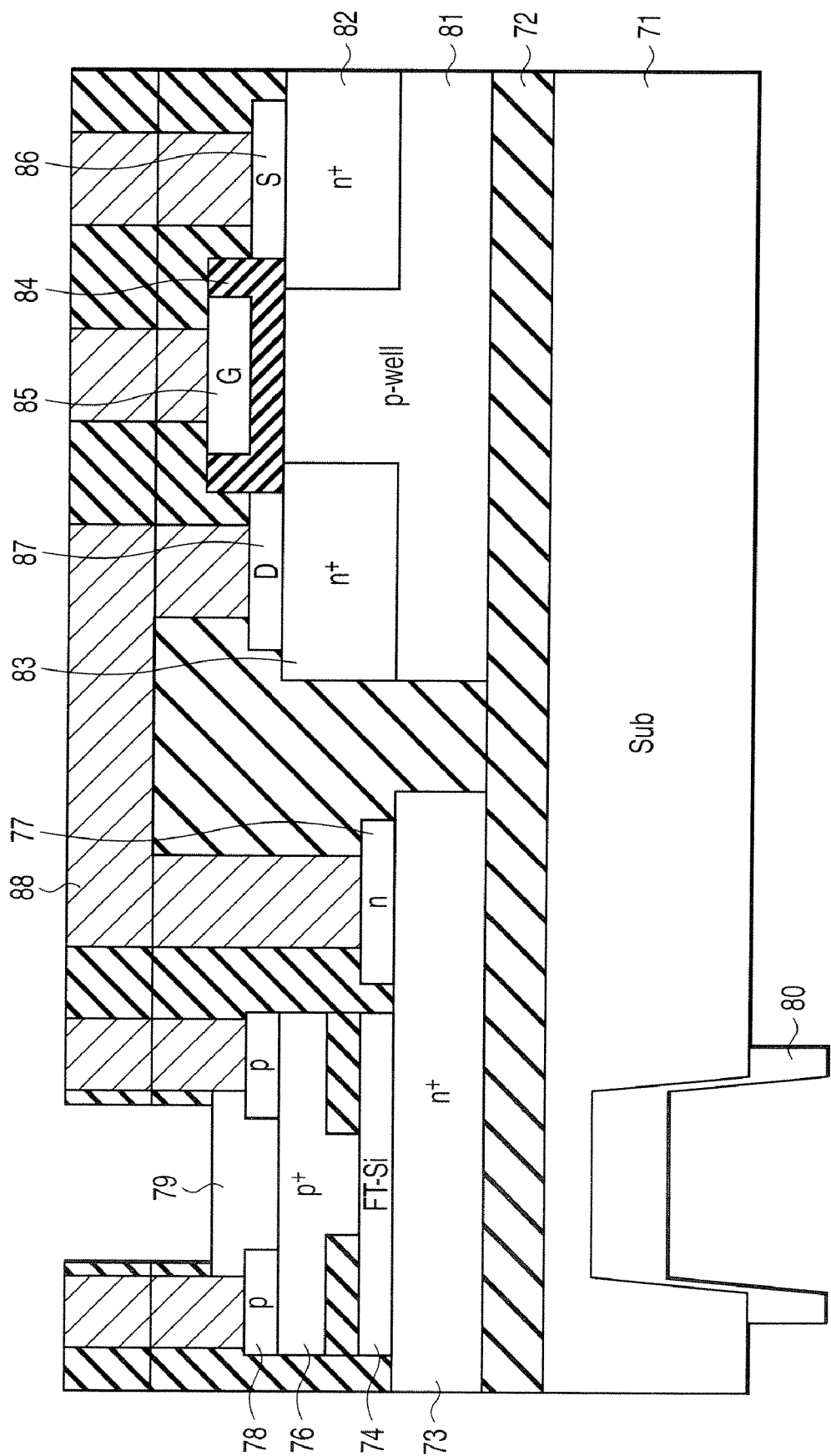
FIG. 21 is a cross-sectional view showing a structure of a photoelectric device array according to the tenth embodiment.

FIG. 21 shows the structure of the photoelectric device array according to this embodiment. The photoelectric device array is prepared by forming on the same substrate an integrated circuit consisting of a light emitting device and a switching device (MOS transistor) adapted to modulate the light output of the light emitting device. The light emitting device consists of a surface emission LD device having the structure equal to that of the ninth embodiment. On the other hand, a p-well region 81, an n$^+$-type source and drain regions 82, 83 are formed on the buried oxide film 72 formed within the substrate 71. A gate electrode 85 is formed on a gate insulating film 84 between the source and drain regions 82, 83. A source electrode 86 and a drain electrode 87 are formed on the source region 82 and the drain region 83, respectively. Further, an n-electrode 77 of the LD device and the drain electrode 87 of the MOS transistor are connected to each other via a wire 88.

Figure 22:
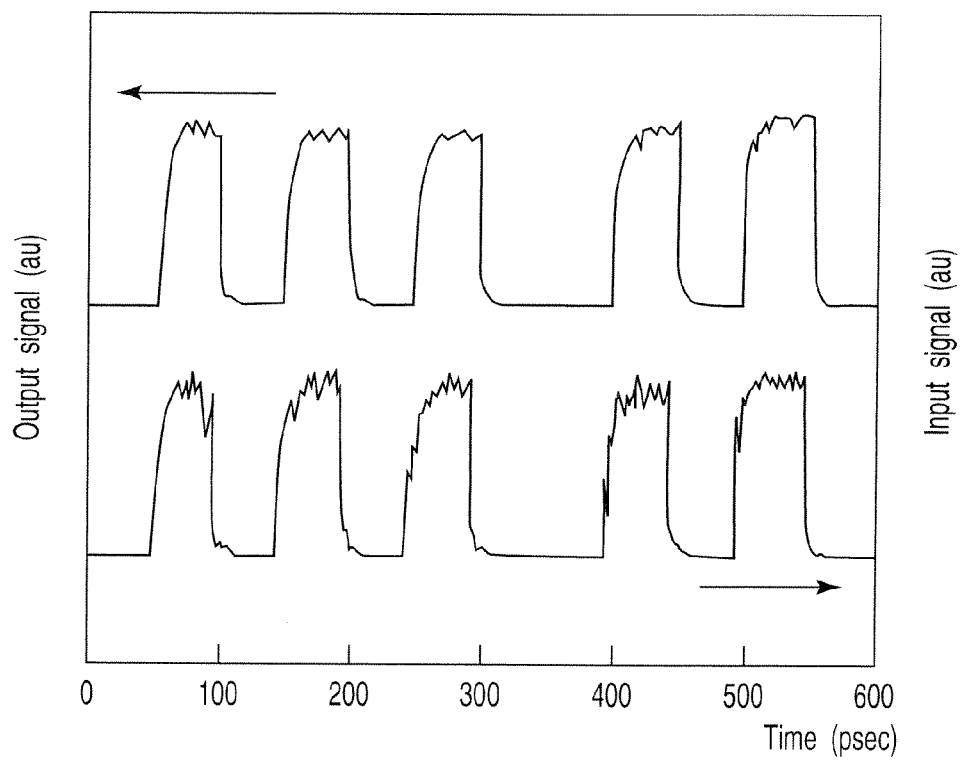
FIG. 22 is graph showing response characteristics of the LD device in the photoelectric device array according to the tenth embodiment.

FIG. 22 is a graph showing the modulated signal (electric signal) supplied to the transistor and the response of the output light generated from the LD device. As apparent from FIG. 22, the output light is modulated under the frequency of 10 GHz relative to the high-speed modulated signal of 10 GHz. This indicates that the photoelectric device array in this embodiment permits the high-speed direct modulation. Although a costly light modulation element is required in the past for coding the output of the LD device, it is unnecessary to use a light modulation element in this embodiment of the present invention.

ELEVENTH EMBODIMENT

Figure 23:
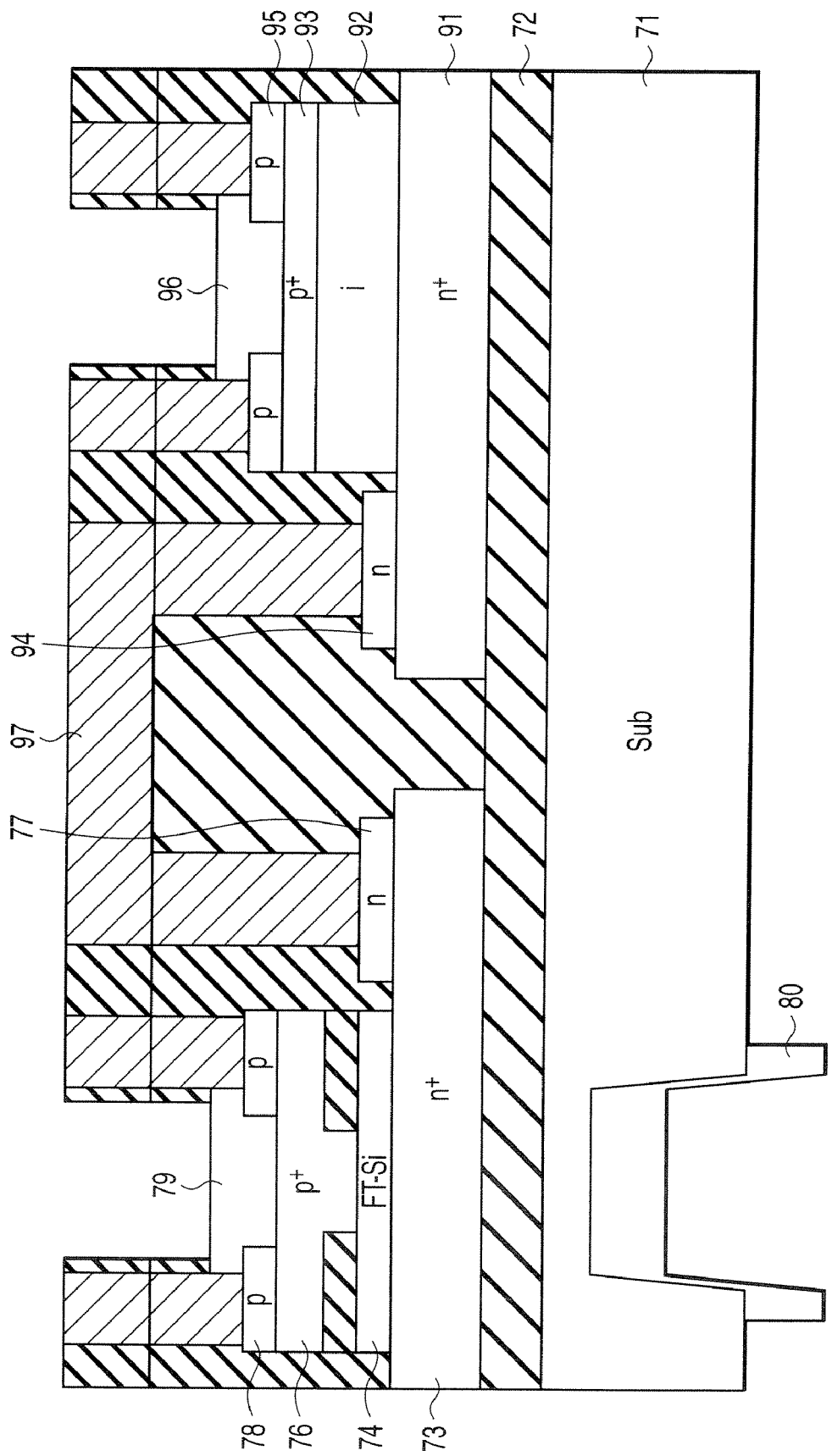
FIG. 23 is a cross-sectional view showing a structure of a light emitting-detecting device array according to the eleventh embodiment.

FIG. 23 shows the structure of the light emitting-detecting device array according to this embodiment. The light emitting-detecting device array is prepared by forming on the same substrate an integrated circuit consisting of a photodetection device and a light emitting device. The light emitting-detecting device array produces the functions of processing the received optical signal and outputting the result of the processing as a new optical signal. The light emitting device is formed of a surface emission LD device constructed like the LD device according to the ninth embodiment. On the other hand, the photodetection device is formed of a germanium photodetection device. An n$^+$ layer 91, an i-layer 92, and a p$^+$ layer 93 are formed on the buried oxide film 72 formed within the substrate 71. The p$^+$ layer 93, the i-layer 92, and the n$^+$ layer 91 are partly etched so as to form an n-electrode 94 that is connected to the n$^+$ layer 91. A p-electrode 95 is formed on the p$^+$ layer 93. The p-electrode 95 is partly etched, and a non-reflective layer 96 is formed. The photodetection device and the light emitting device are connected in series via a wire 97. The light emitting-detecting device array has a relaying function for outputting the input optical signal with its waveform left unchanged.

Figure 24:
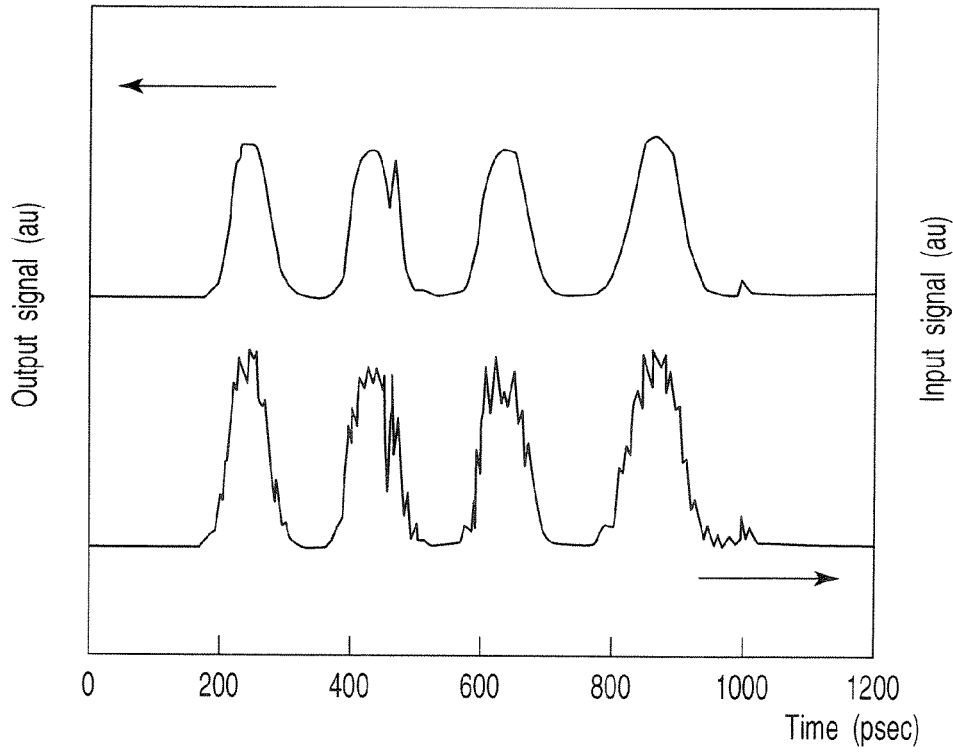
FIG. 24 is a graph showing response characteristics of the LD device in the light emitting-detecting device array according to the eleventh embodiment.

FIG. 24 is a graph showing the optical signal supplied to the photodetection device and having a wavelength of 850 nm and response of the output light generated from the LD device. As apparent from FIG. 24, an output light of the same waveform is obtained relative to an input signal modulated under the frequency of 5 GHz. In this fashion, the light emitting-detecting device array in this embodiment permits a signal relay at a high speed.

TWELFTH EMBODIMENT

Figure 25:
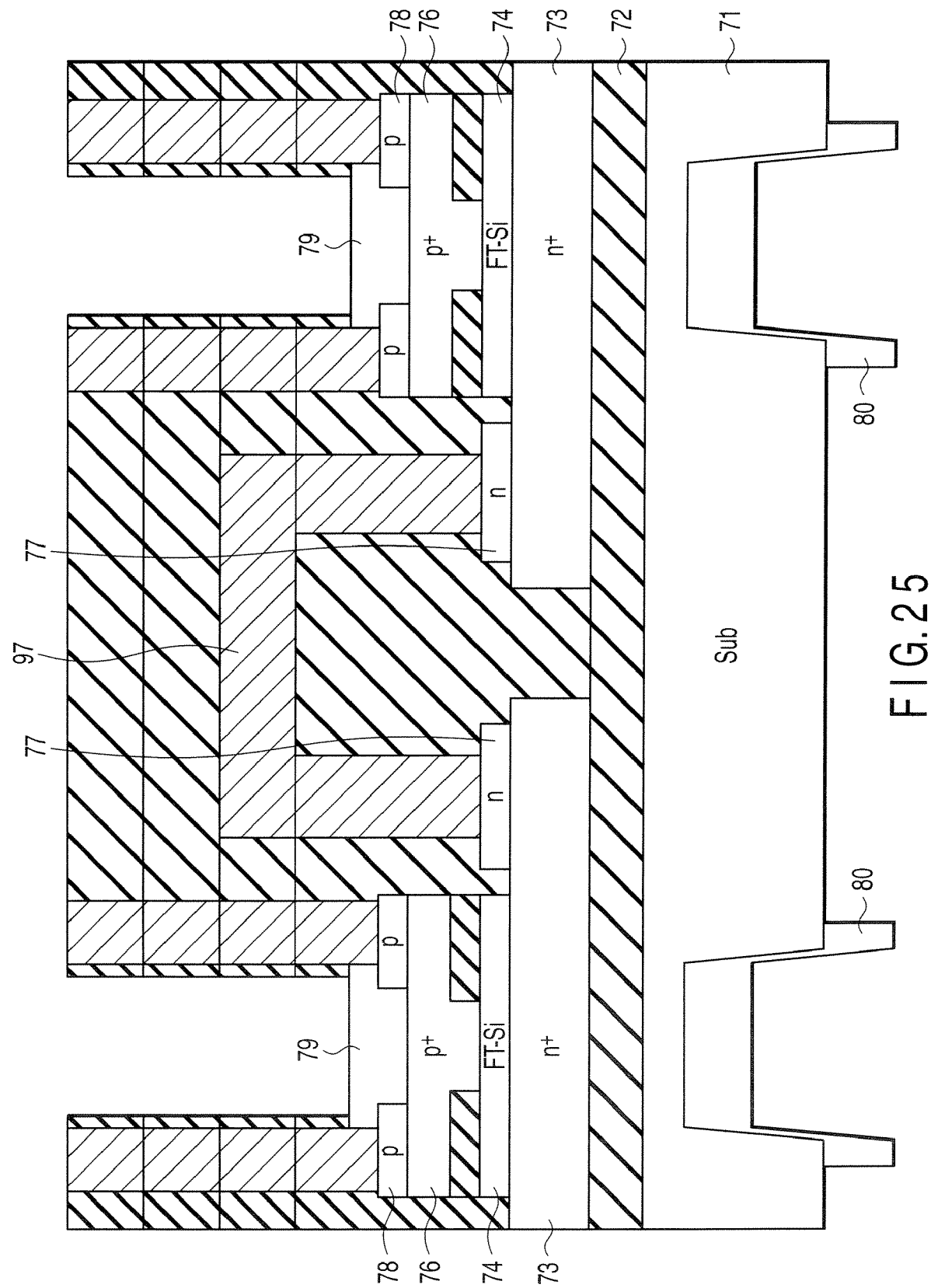
FIG. 25 is a cross-sectional view showing a structure of a light emitting device array according to the twelfth embodiment.

FIG. 25 shows the structure of the light emitting device array according to this embodiment. In this light emitting device array, plural light emitting devices are formed integrally on the same substrate for optically outputting an image signal. Each of the plural light emitting devices is equal to the surface emission type LD device constructed as in the ninth embodiment. The plural light emitting devices are connected to each other via a wire 99.

Figure 26B:
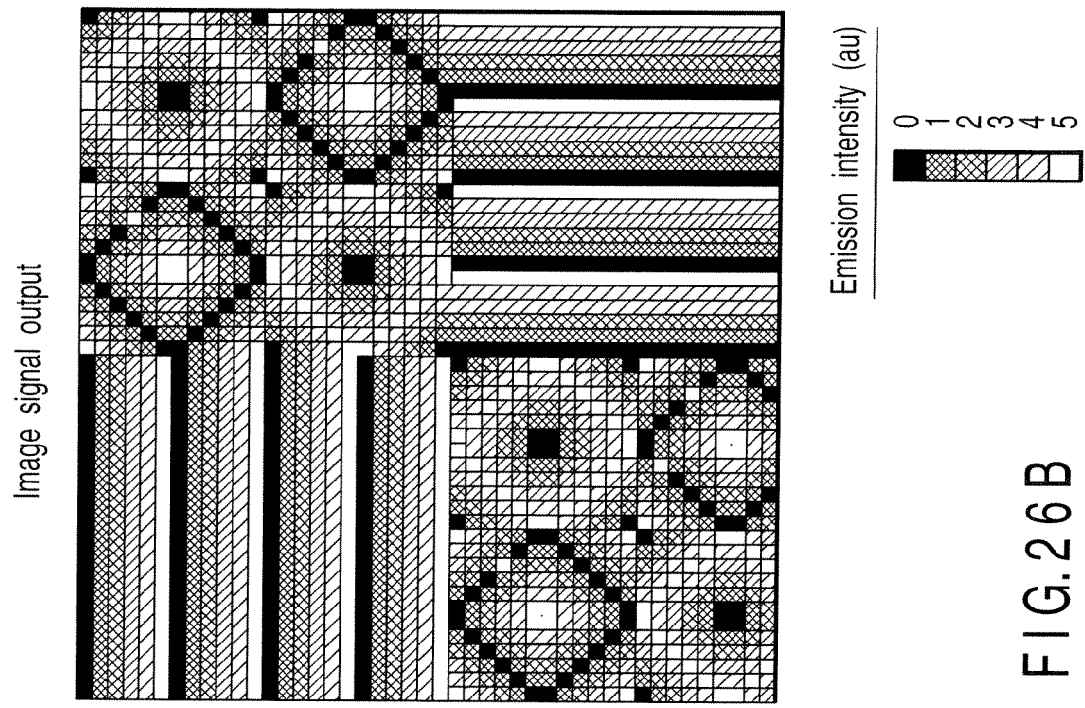
FIGS. 26A and 26B show the input image and the output image, respectively, of the LD device in the light emitting device array according to the twelfth embodiment.
Figure 26A:
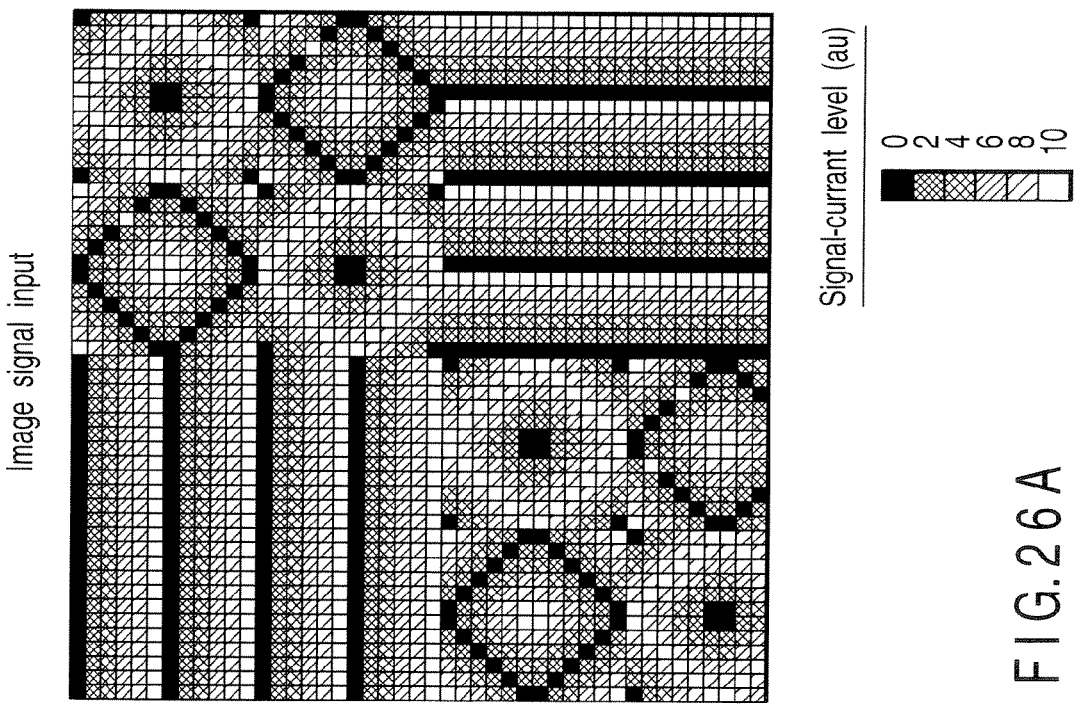

FIGS. 26A and 26B show an image signal (electric signal) supplied to the LD device array and an output image (optical signal) generated from the LD device array. As apparent from FIGS. 26A and 26B, it is possible to obtain an output image reproducing the input image with a high fidelity.

THIRTEENTH EMBODIMENT

Figure 27:
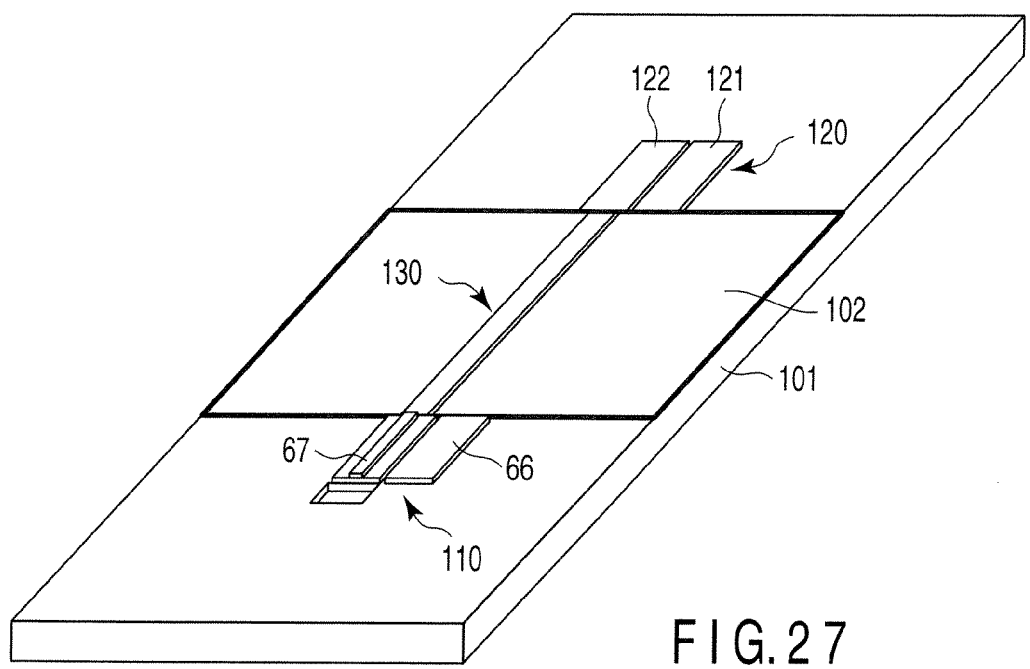
FIG. 27 is a perspective view showing a structure of an optical device array according to the thirteenth embodiment.

FIG. 27 shows the structure of the optical device array according to this embodiment. In this optical device array, a light emitting device, a photodetection device and a waveguide for connecting the photodetection device and the light emitting device are formed integrally on the same substrate. The optical device array permits generating, transmitting and receiving an optical signal.

As shown in FIG. 27, an edge surface emission type LD device 110 for generating a signal and a germanium photodetection device 120 for receiving the signal are formed on a silicon substrate 101. An oxide film 102 is formed between the LD device 110 and the photodetection device 120, and a Si waveguide 130 for transmitting the optical signal is formed on the oxide film 102. The edge surface emission type LD device 110 is equal in structure to that of the eighth embodiment. The n-electrode 66 and the p-electrode 67 are shown in FIG. 27. A trench is formed in the substrate 101 in the vicinity of the LD device 110 so as to expose the edge surface to the outside. FIG. 27 also shows an n-electrode 121 and a p-electrode 122 in respect of the germanium photodetection device 120.

Figure 28:
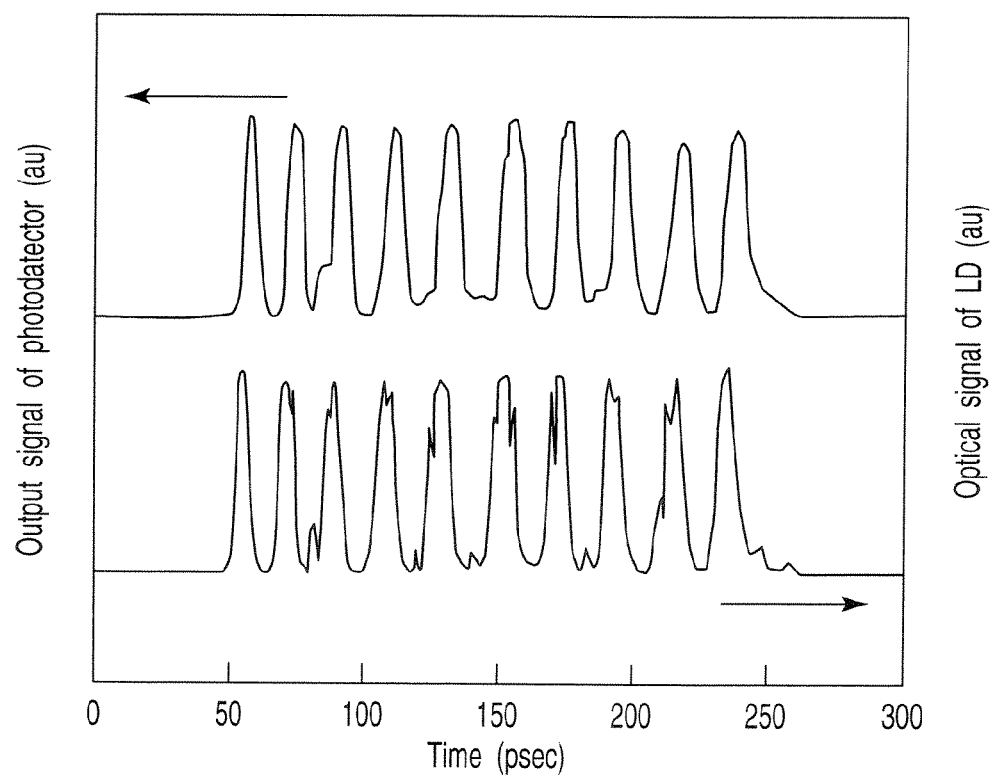
FIG. 28 is a graph showing response characteristics of a photodetection device to input signals supplied from the laser diode (LD device) in the optical device array according to the thirteenth embodiment.

FIG. 28 is a graph showing the optical signal generated from the LD device and the output response of the photodetection device. As apparent from FIG. 28, the output signal is modulated under the frequency of 50 GHz relative to the high-speed modulated signal under the frequency of 50 GHz. In this fashion, the optical device array in this embodiment permits transmission of an optical signal at a high speed. It is technically impossible in the past to form on a wafer an optical wiring unit for transmitting an optical signal. However, this embodiment makes it possible to form such an optical wiring unit.

FOURTEENTH EMBODIMENT

A phosphor that can be excited by a light source, an electron source or an X-ray source will be described. The phosphor is in the form of a powdery crystal containing an FT semiconductor as a main component. The FT semiconductor consists of an NF-doped FT-SiC comprising silicon carbide (SiC) as the matrix semiconductor, the N atom as the heteroatom D and F atom as the heteroatom Z. The NF concentration is adjusted at three levels of $9 \times 10^{17}/cm^3$, $1.2 \times 10^{19}/cm^3$, and $1.6 \times 10^{20}/cm^3$.

The band gap is estimated at about 3 eV from the band calculation of the NF-doped FT-SiC, and a blue emission is expected to be generated. Also, since the interband transition is electric dipole transition, the emission recombination life is expected to be short so as to achieve intense emission efficiently.

When the phosphor is excited with light such as an ultraviolet light, it is possible to obtain blue PL emission. Where the emission intensity of the PL emission spectrum relative to the NF pair concentration is examined, it is found that the number of NF pairs tends to be proportional to the emission intensity. Such being the situation, the NF pairs are considered to act as localized luminescent centers.

Various materials other than those described above can be used as the materials of the phosphor. For example, it is possible to use the B atom as the heteroatom D and the K atom as the heteroatom Z in the case where the matrix semiconductor is formed of SiC. It is also possible to use the O atom as the heteroatom D and the F atom as the heteroatom Z in the case where the matrix semiconductor is formed of BP. It is also possible to use the various combinations of the materials described previously.

FIFTEENTH EMBODIMENT

The phosphor in this embodiment is formed of an AlNa-doped FT-SiC comprising silicon carbide (SiC) used as the matrix semiconductor, the Al atom used as the heteroatom D and the Na atom used as the heteroatom Z. The AlNa concentration is about $5 \times 10^{20}/cm^3$.

The band gap is estimated at about 3 eV from the band calculation of the AlNa-doped FT-SIC, and a blue emission is expected to be generated. When the PL emission is examined, it is possible to obtain a blue-green emission, which is substantially coincident with the estimation based on the calculation.

SIXTEENTH EMBODIMENT

Phosphors are obtained as in the fourteenth and fifteenth embodiments by using various materials as the matrix semiconductor, the heteroatom D substituted for the lattice site and the heteroatom Z inserted into the interstitial site.

Table 2 shows (1) the matrix semiconductor of the phosphor, (2) the lattice site substituted by the heteroatom D, (3) the heteroatom D substituted for the lattice site, (4) the heteroatom Z inserted into the interstitial site, (5) the DZ pair concentration estimated from the Z concentration, and (6) the PL emission wavelength.

As shown in Table 2, the PL emission can be generated efficiently by introducing the pendant type FT structure into an indirect semiconductor.

TABLE 2

| (1) Matrix semiconductor | (2) Lattice site substituted by D (group) | (3) D (group) | (4) Z (group) | (5) DZ pair concentration (/cm³) | (6) Emission wavelength (nm) |
| --- | --- | --- | --- | --- | --- |
| AlP | P (15) | Si (14) | Na (1) | 6.18E+20 | 520 |
| GaP | Ga (13) | Si (14) | F (17) | 3.18E+20 | 560 |
| GaP | Ga (13) | Mg (2) | K (1) | 2.3E+20 | 565 |
| GaP | Ga (13) | Zn (12) | Na (1) | 5.2E+20 | 570 |
| GaP | P (15) | Se (16) | F (17) | 4.18E+20 | 570 |
| AlAs | P (15) | Se (16) | F (17) | 5.1E+20 | 590 |
| AlSb | Sb (15) | Se (16) | F (17) | 6.18E+20 | 785 |
| AlSb | Sb (15) | Te (16) | F (17) | 5.5E+20 | 790 |

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light emitting device, comprising:
an active layer comprising atoms A of a matrix semiconductor having a tetrahedral structure, a heteroatom D substituted for the atom A in a lattice site, and a heteroatom Z inserted into an interstitial site positioned closest to the heteroatom D, the heteroatom D having a valence electron number differing by +1 from that of the atom A, and the heteroatom Z having an electron configuration of a closed shell structure through charge compensation with the heteroatom D; and
an n-electrode and a p-electrode adapted to supply a current to the active layer.

2. The light emitting device according to claim 1, wherein the matrix semiconductor is selected from the group consisting of IVb elemental semiconductors and IVb-IVb compound semiconductors, the heteroatom D is selected from the group consisting of Va elements and Vb elements, and the heteroatom Z is selected from the group consisting of VIIb elements.

3. The light emitting device according to claim 1, wherein the matrix semiconductor is selected from the group consisting of IIIb-Vb compound semiconductors, the heteroatom D is selected from the group consisting of IVa elements and IVb elements and substituted for the atom A of IIIb, and the heteroatom Z is selected from the group consisting of VIIb elements.

4. The light emitting device according to claim 1, wherein the matrix semiconductor is selected from the group consisting of IIIb-Vb compound semiconductors, the heteroatom D is selected from the group consisting of VIa elements and VIb elements and substituted for the atom A of Vb, and the heteroatom Z is selected from the group consisting of VIIb elements.

5. The light emitting device according to claim 1, further comprising: an n-layer formed between the active layer and the n-electrode so as to be in contact with the active layer, and a p-layer formed between the active layer and the p-electrode so as to be in contact with the active layer, wherein the n-layer, the active layer and the p-layer are laminated one upon the other.

6. The light emitting device according to claim 1, further comprising: an n-layer formed between the active layer and the n-electrode so as to be in contact with the active layer, and a p-layer formed between the active layer and the p-electrode so as to be in contact with the active layer, wherein the n-layer, the active layer and the p-layer are arranged in-plane.

7. The light emitting device according to claim 1, further comprising a non-reflective film formed on one edge surface of the active layer and a reflective film formed on the other edge surface of the active layer.

8. The light emitting device according to claim 1, wherein the n-electrode or the p-electrode is arranged as a surface electrode, and a non-reflective film is formed in an upper portion of the active layer which is not covered with the surface electrode and a reflective film is formed in a lower portion of the active layer so as to face the non-reflective layer.

9. The light emitting device according to claim 1, wherein the n-electrode or the p-electrode is arranged as a surface electrode, and the surface electrode is transparence.

10. The light emitting device according to claim 1, further comprising an optical resonator having a pair of mirror surfaces arranged to have the active layer sandwiched therebetween in a in-plane direction of the active layer and differing from each other in reflectance.

11. The light emitting device according to claim 1, further comprising an optical resonator having a pair of mirror surfaces arranged to have the active layer sandwiched therebetween in a vertical direction to a plane of the active layer and differing from each other in reflectance.

12. A photoelectric device array, comprising the light emitting device according to claim 1, and a transistor, which are formed on the same substrate.

13. A light emitting-detecting device array, comprising the light emitting device according to claim 1, and a photodetection device, which are formed on the same substrate.

14. A light emitting device array, comprising a plurality of the light emitting devices according to claim 1, which are formed on the same substrate.

15. An optical device array, comprising the light emitting device according to claim 1, a photodetection device, and a waveguide connecting the light emitting device with the photodetection device, which are formed on the same substrate.

* * * * *